(12) United States Patent
Murakami et al.

(10) Patent No.: US 7,793,404 B2
(45) Date of Patent: Sep. 14, 2010

(54) RESONANT-OSCILLATING-DEVICE FABRICATION METHOD

(75) Inventors: Kenichi Murakami, Kuwana (JP); Nobuaki Asai, Hashima-gun (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 459 days.

(21) Appl. No.: 11/727,840

(22) Filed: Mar. 28, 2007

(65) Prior Publication Data
US 2007/0180672 A1   Aug. 9, 2007

Related U.S. Application Data

(63) Continuation-in-part of application No. PCT/JP2005/017722, filed on Sep. 27, 2005.

(30) Foreign Application Priority Data

Sep. 30, 2004 (JP) ............................. 2004-288077
Sep. 30, 2004 (JP) ............................. 2004-288508

(51) Int. Cl.
*H04R 31/00* (2006.01)
(52) U.S. Cl. .................... 29/594; 29/25.35; 29/593; 29/609.1; 181/171; 181/172; 216/62; 216/65; 216/66; 310/313 A; 310/313 R; 310/361; 367/163; 367/174; 367/178; 367/181
(58) Field of Classification Search ............... 29/25.25, 29/593, 594, 609.1; 156/89.11, 89.12, 250; 181/171, 172; 216/62, 65, 66; 310/313 A, 310/313 R, 361; 367/163, 174, 178, 181
See application file for complete search history.

(56) References Cited

U.S. PATENT DOCUMENTS

| 5,682,814 | A | * | 11/1997 | Imaichi et al. ............... 100/315 |
| 2004/0164645 | A1 | * | 8/2004 | Oshio ..................... 310/313 B |
| 2004/0174092 | A1 | | 9/2004 | Iwata |
| 2005/0219674 | A1 | | 10/2005 | Asai et al. |

FOREIGN PATENT DOCUMENTS

| JP | A 5-27191 | 2/1993 |
| JP | A 8-75475 | 3/1996 |

(Continued)

OTHER PUBLICATIONS

May 25, 2010 Notification of Reasons of Rejection issued in JP-2004-288508 with English-language translation.

*Primary Examiner*—Paul D Kim
(74) *Attorney, Agent, or Firm*—Oliff & Berridge, PLC

(57) ABSTRACT

A resonant-oscillating-device fabrication method for integrally forming a structure comprising a support, a beam vibratably extending from the support, and an oscillating element which is supported by the beam so as to oscillate in resonance with the vibration of the beam at a desired resonant frequency, by using a substrate. The resonant-oscillating-device fabrication method having a thickness measurement step of measuring the thickness of the substrate, an etching condition determination step of determining conditions of etching a portion forming the beam in the substrate to provide the desired resonant frequency, in accordance with the thickness of the substrate measured in the thickness measurement step, and an etching step of etching the substrate in accordance with the etching conditions.

7 Claims, 17 Drawing Sheets

FOREIGN PATENT DOCUMENTS

| | | |
|---|---|---|
| JP | A-08-105748 | 4/1996 |
| JP | A-11-064001 | 3/1999 |
| JP | A 2001-102654 | 4/2001 |
| JP | A 2002-217665 | 8/2002 |
| JP | A-2002-228965 | 8/2002 |
| JP | A 2004-165743 | 6/2004 |
| JP | A 2004-177543 | 6/2004 |
| JP | A 2004-191953 | 7/2004 |
| JP | A 2002-228965 | 8/2004 |
| JP | A 2004-260455 | 9/2004 |
| WO | WO 2004/049035 A1 | 6/2004 |

\* cited by examiner (a)

(b)

(c)

(d)

(e)

(f)

(g)

RESONANT-OSCILLATING-DEVICE FABRICATION METHOD

This is a Continuation-in-Part of International Application No. PCT/JP2005/017722 filed Sep. 27, 2005, which claims priority from Japanese Patent Applications No. 2004-288077 filed Sep. 30, 2004 and No. 2004-288508 filed Sep. 30, 2004. The entire disclosure of the prior applications is hereby incorporated by reference herein its entirety.

BACKGROUND

1. Technical Field

Aspects of the present invention relate to methods of fabricating optical scanners using the vibration of a beam and other resonant oscillating devices.

2. Related Art

As one resonant-oscillating-device fabrication method of this type, Japanese Patent Provisional Publication No. 2002-228965 (hereafter, referred to as JP2002-228965A) discloses a method of fabricating a galvano device. In the fabrication method disclosed in JP2002-228965A, both a reflecting mirror and a torsion bar are formed on a silicon substrate in such a manner that the torsion bar shakably supports the reflecting mirror. According to JP2002-228965A, if the resonant frequency of the reflecting mirror is likely to differ from a predetermined value, the reflecting mirror and the torsion bar are etched to adjust the resonant frequency of the reflecting mirror to the predetermined resonant frequency.

According to the galvano device fabrication method, after both the reflecting mirror and the torsion bar are formed on the silicon substrate, the resonant frequency of the reflecting mirror is adjusted to the predetermined value by etching. The additional process steps of adjustment by etching would increase the galvano-device fabrication process steps.

SUMMARY

Aspects of the present invention are advantageous in that a resonant-oscillating-device fabrication method, that can bring about a predetermined resonant frequency without depending on any additional process, can be provided.

To solve the above-described situation, in a resonant-oscillating-device fabrication method provided from one aspect of the present invention, a structure that includes a support, a beam extending vibratably from the support, and an oscillating element which is supported by the beam so as to oscillate in resonance with the vibration of the beam is integrally formed by using a substrate, and a piezoelectric element for driving the beam into vibration is formed at the beam by a structure having a piezoelectric layer between two electrodes. The resonant-oscillating-device fabrication method includes a thickness measurement step of measuring the thickness of the substrate, a piezoelectric-layer formation condition determination step of determining the conditions of forming the piezoelectric layer to bring the frequency of resonant oscillation of the oscillating element to a desired resonant frequency in accordance with the thickness of the substrate measured in the thickness measurement step, and a piezoelectric-element formation step of forming the piezoelectric element in accordance with the piezoelectric-layer formation conditions determined in the piezoelectric-layer formation condition determination step.

The piezoelectric-layer formation conditions are determined to bring the frequency of resonant oscillation of the oscillating element to the desired resonant frequency in accordance with the measured thickness of the substrate, and the piezoelectric element is formed in accordance with the piezoelectric-layer formation conditions. Accordingly, the desired resonant frequency of the oscillating element can be obtained with high precision in the resonant-oscillating-device fabrication process. As a result, a process of readjusting the resonant frequency of the oscillating element to the desired value becomes unnecessary after the resonant oscillating device is fabricated, and the resonant-oscillating-device fabrication process can be simplified.

In a resonant-oscillating-device fabrication method provided from another aspect of the present invention, a structure that includes a support (10), a beam (20) extending vibratably from the support, and an oscillating element (30) which is supported by the beam so as to oscillate in resonance with the vibration of the beam at a desired resonant frequency is integrally formed by using a substrate (100). The resonant-oscillating-device fabrication method includes a thickness measurement step (S121) of measuring the thickness of the substrate, an etching condition determination step (S122) of determining the conditions of etching a portion forming the beam in the substrate to provide the desired resonant frequency in accordance with the thickness of the substrate measured in the thickness measurement step, and etching steps (S123 to S126) of etching the substrate in accordance with the etching conditions.

The thickness of the substrate is measured, and the etching conditions are determined to obtain the desired resonant frequency in accordance with the measured thickness, and the substrate is etched according to the etching conditions, so that the desired resonant frequency can be obtained with high precision irrespective of variations in thickness of the substrate. Accordingly, after the etching step, the substrate does not need to be etched again to obtain the desired resonant frequency. As a result, the resonant frequency of the resonant oscillating device can be adjusted to a desired value with high precision, without the need for adding an extra process to the resonant-oscillating-device fabrication process.

BRIEF DESCRIPTION OF THE ACCOMPANYING DRAWINGS

Figure 1:
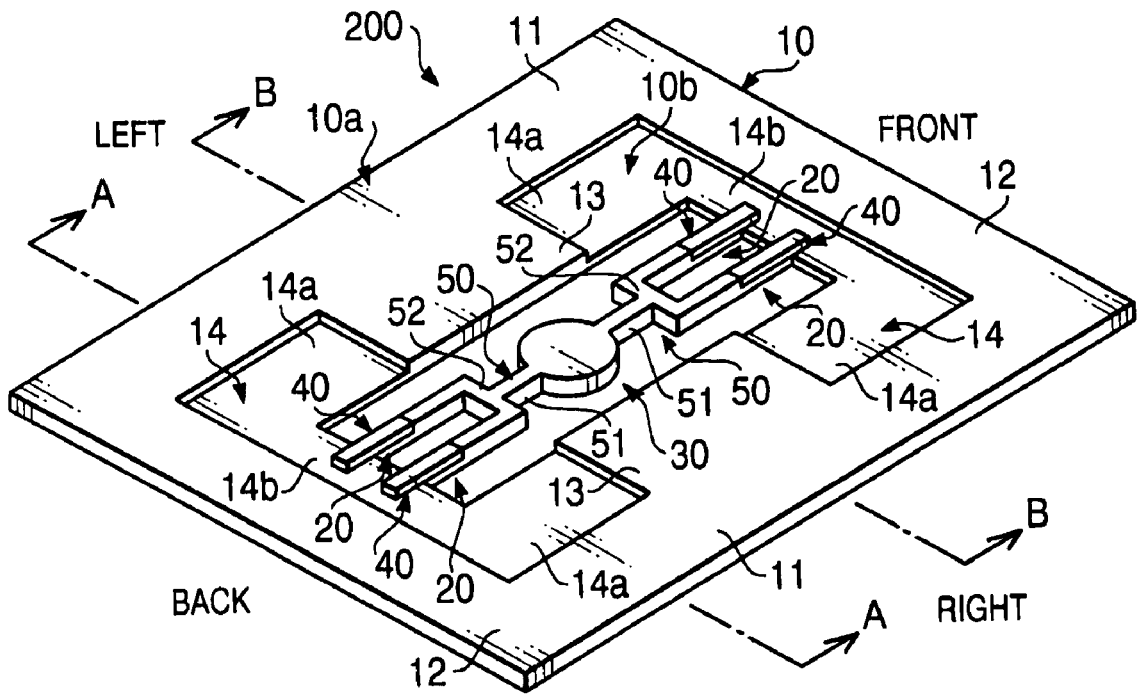
FIG. 1 is a perspective view showing an optical scanner to which the present invention is applied, according to a first embodiment.

FIGS. 5(a) to 5(g) are general sectional views showing changes in a sectional structure in the fabrication process of the first embodiment, taken along line A-A in FIG. 1.

Figure 6:
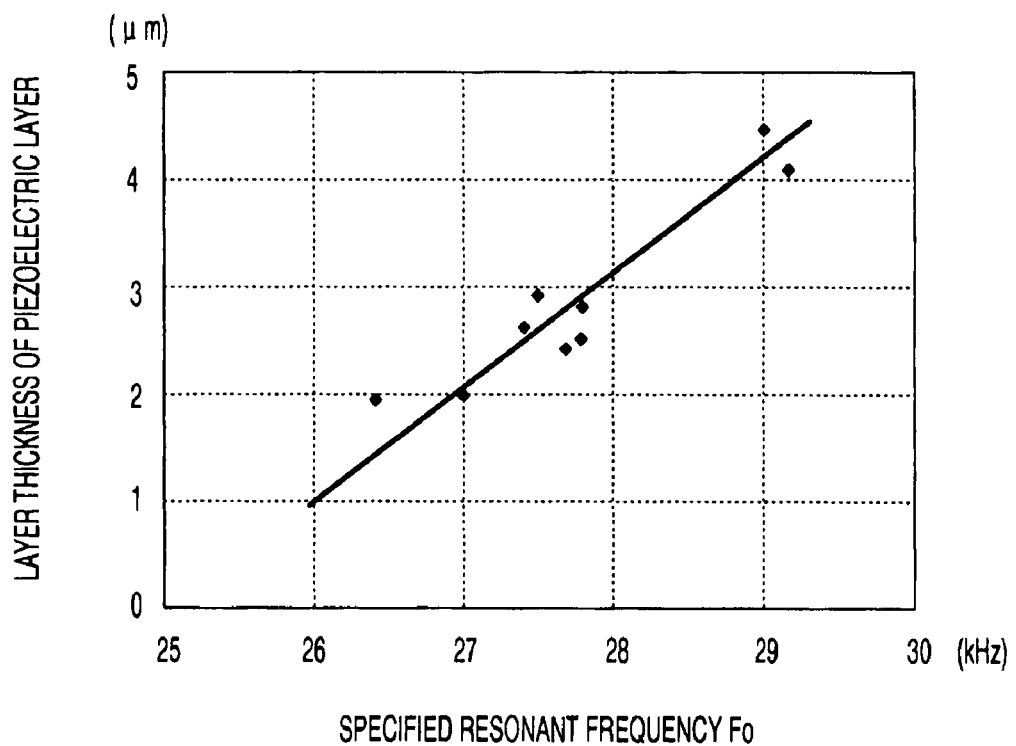

FIG. 6 is a graph showing the relationship between the thickness of a piezoelectric layer and a specified resonant frequency in the first embodiment.

Figure 7:
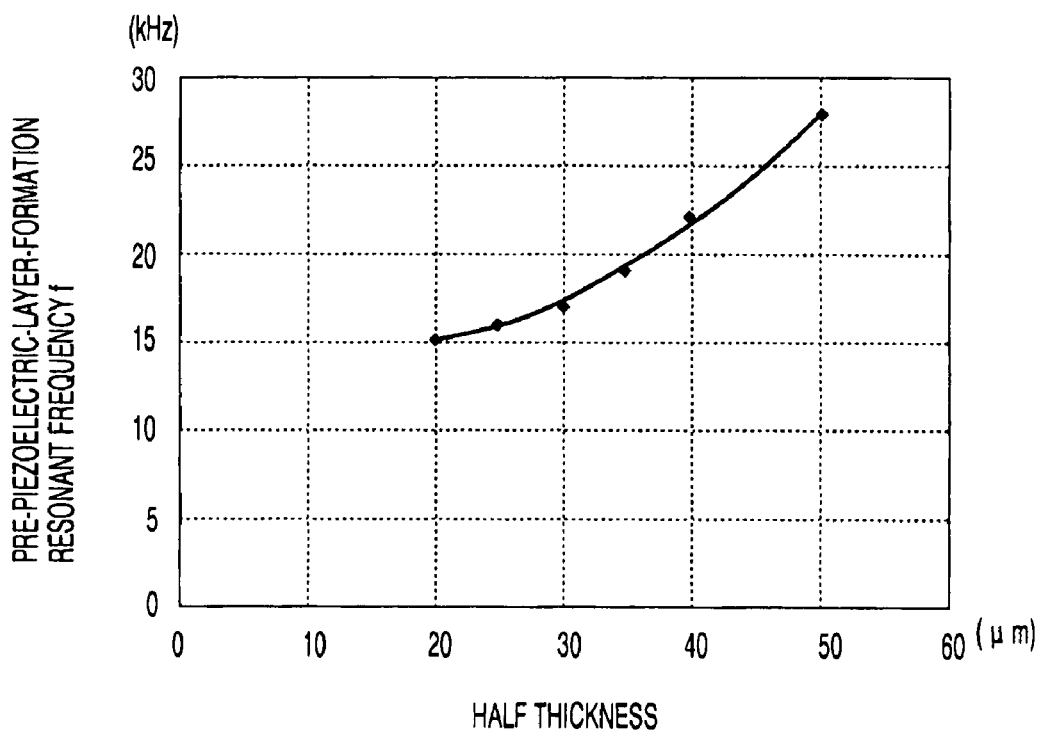

FIG. 7 is a graph showing the relationship between a resonant frequency before the piezoelectric layer is formed and the half of thickness in the first embodiment.

Figure 8:
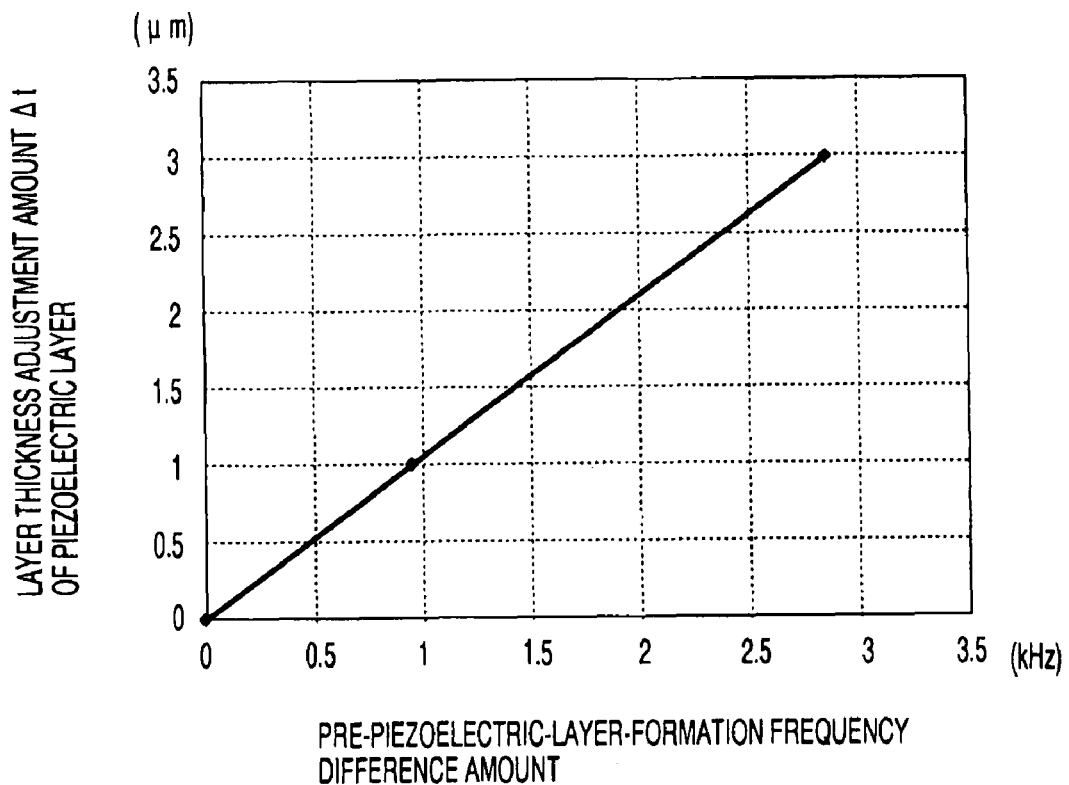

FIG. 8 is a graph showing the relationship between a piezoelectric layer thickness adjustment amount and a frequency difference amount before the piezoelectric layer is formed in the first embodiment.

Figure 9:
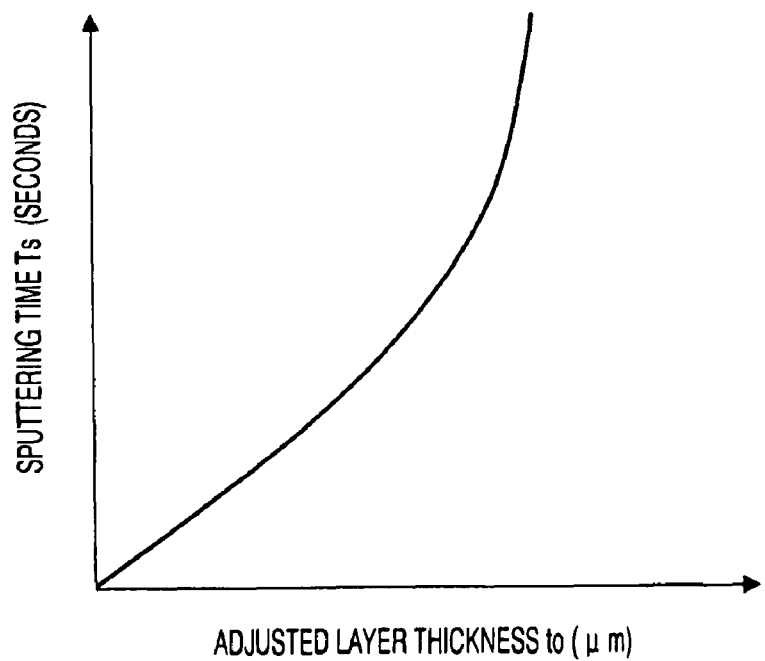

FIG. 9 is a graph showing the relationship between a sputtering time and an adjusted layer thickness in the first embodiment.

Figure 10:
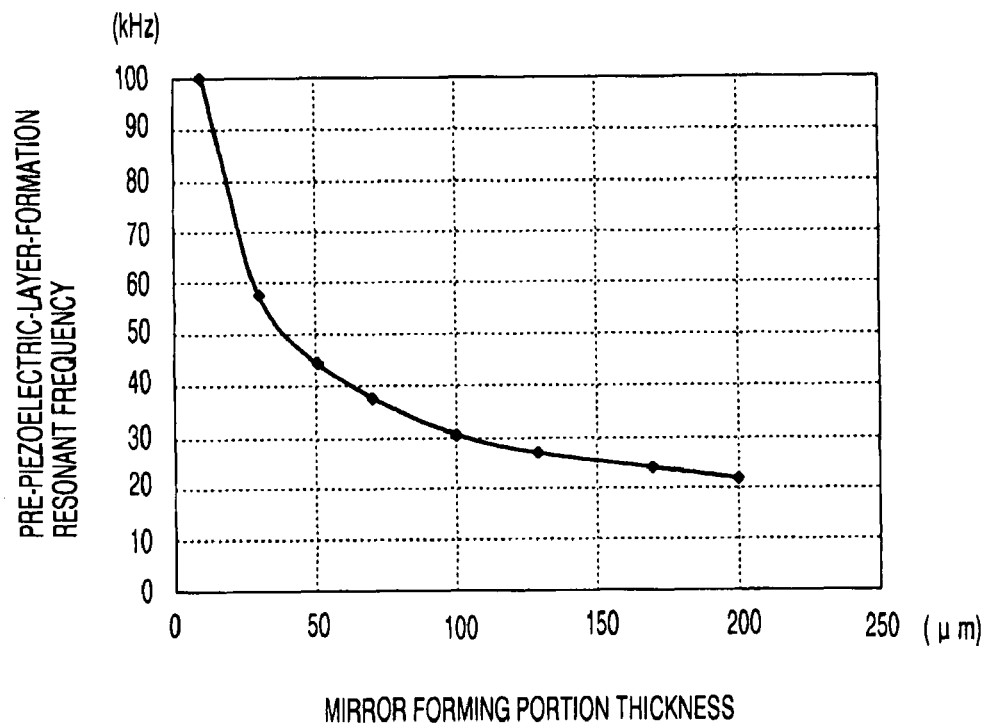

FIG. 10 is a graph showing the relationship between a resonant frequency before the piezoelectric layer is formed and the thickness of a mirror forming portion in a second embodiment of the present invention.

Figure 11:
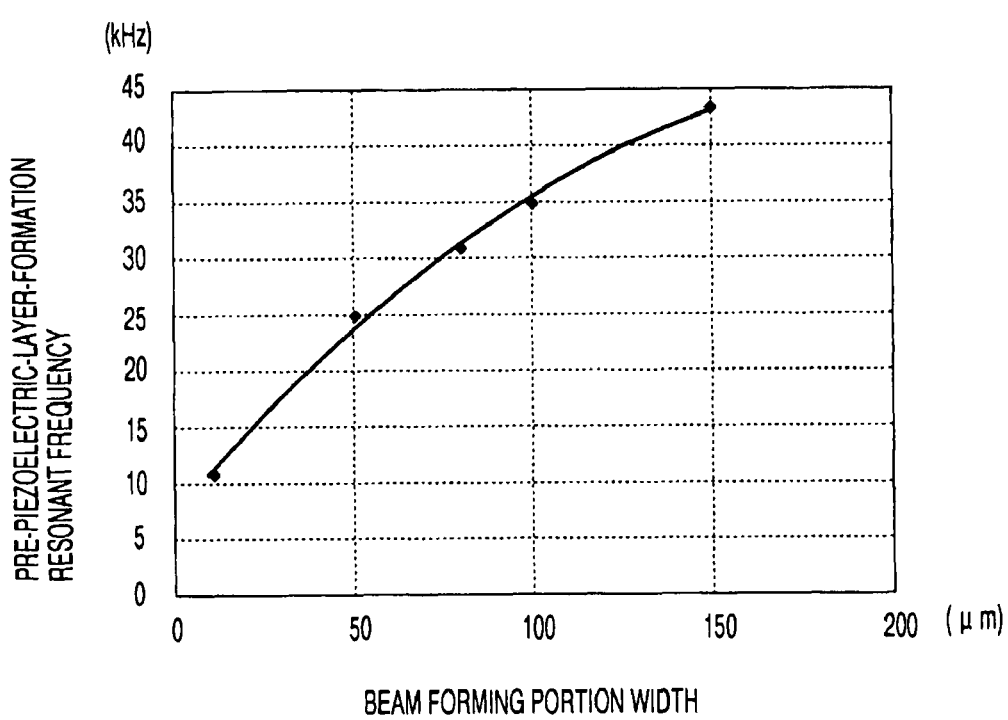

FIG. 11 is a graph showing the relationship between a resonant frequency before the piezoelectric layer is formed and the width of a beam forming portion in a third embodiment of the present invention.

Figure 12:
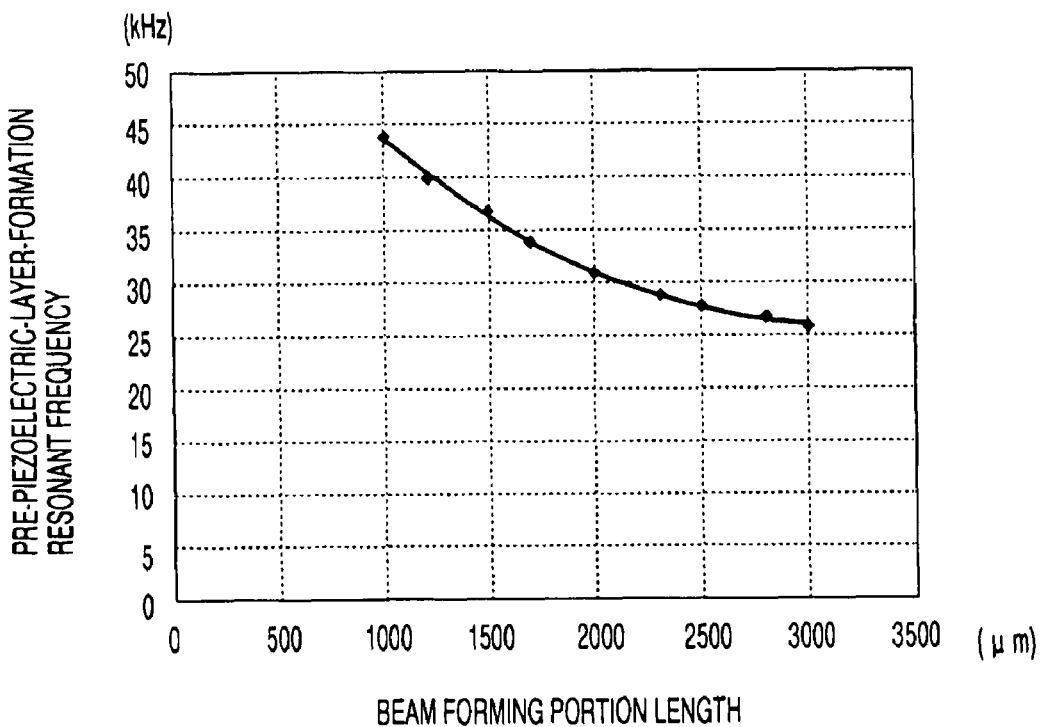

FIG. 12 is a graph showing the relationship between the resonant frequency before the piezoelectric layer is formed and the length of the beam forming portion in the third embodiment.

Figure 13:
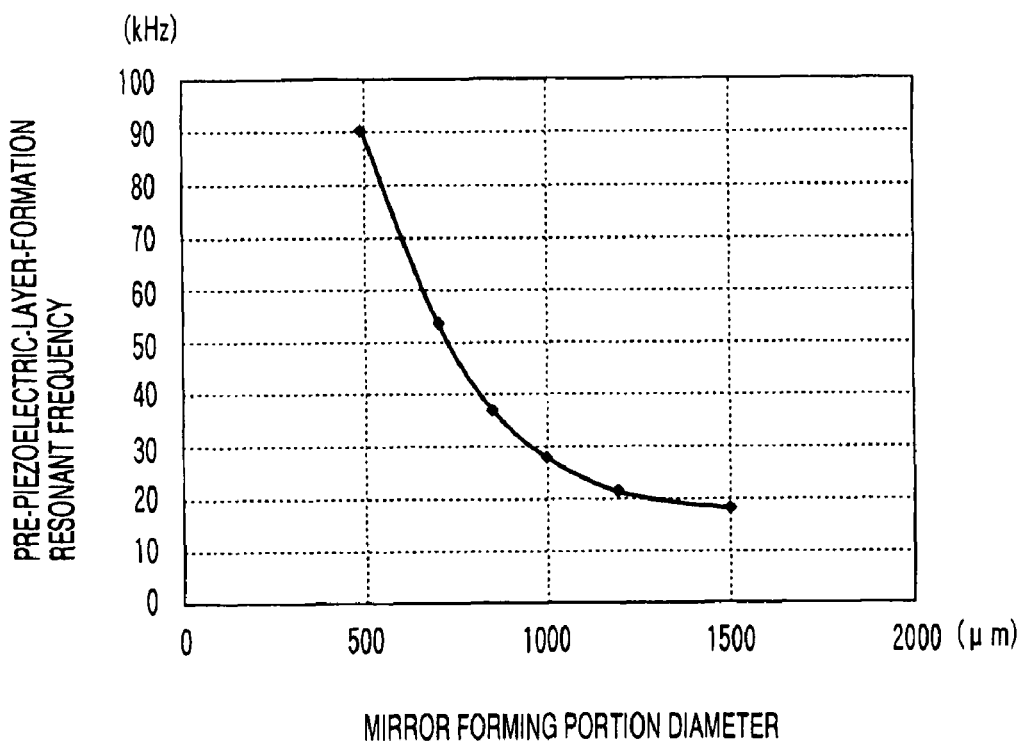

FIG. 13 is a graph showing the relationship between the resonant frequency before the piezoelectric layer is formed and the diameter of a mirror forming portion in the third embodiment.

Figure 14:
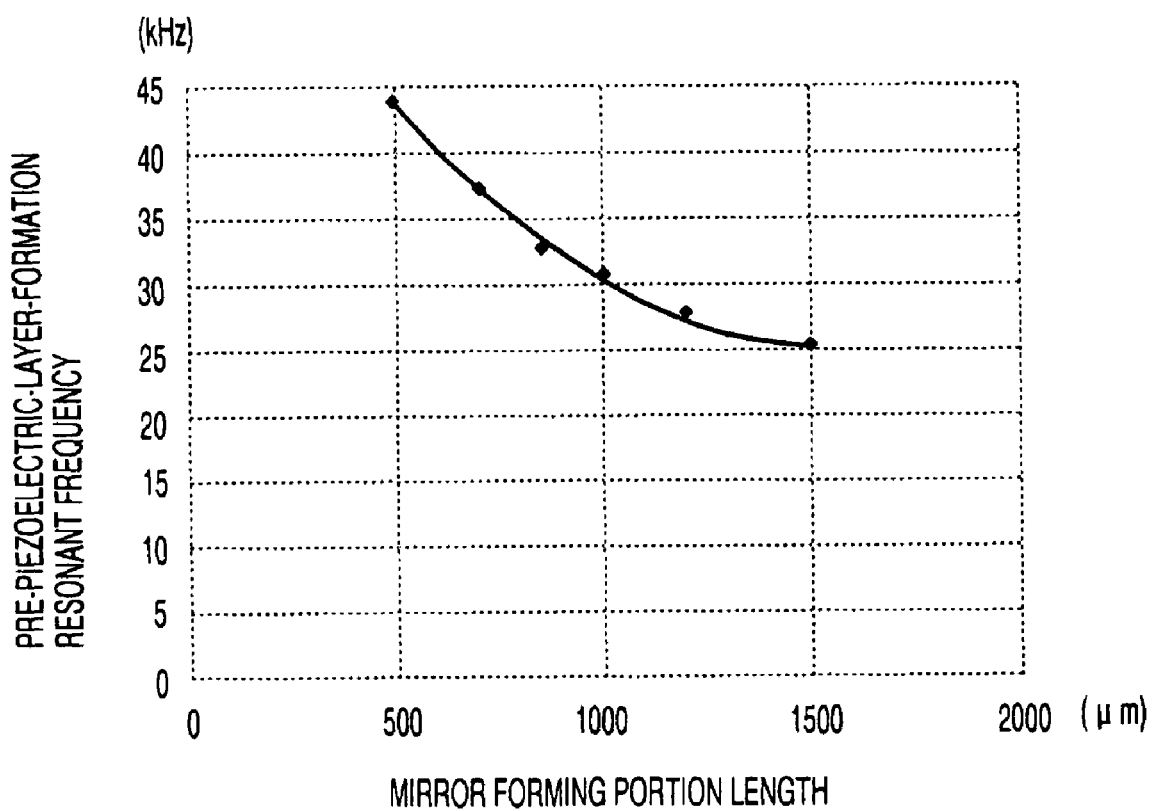

FIG. 14 is a graph showing the relationship between a resonant frequency before the piezoelectric layer is formed and the length of a mirror forming portion in a modification of the third embodiment.

Figure 15:
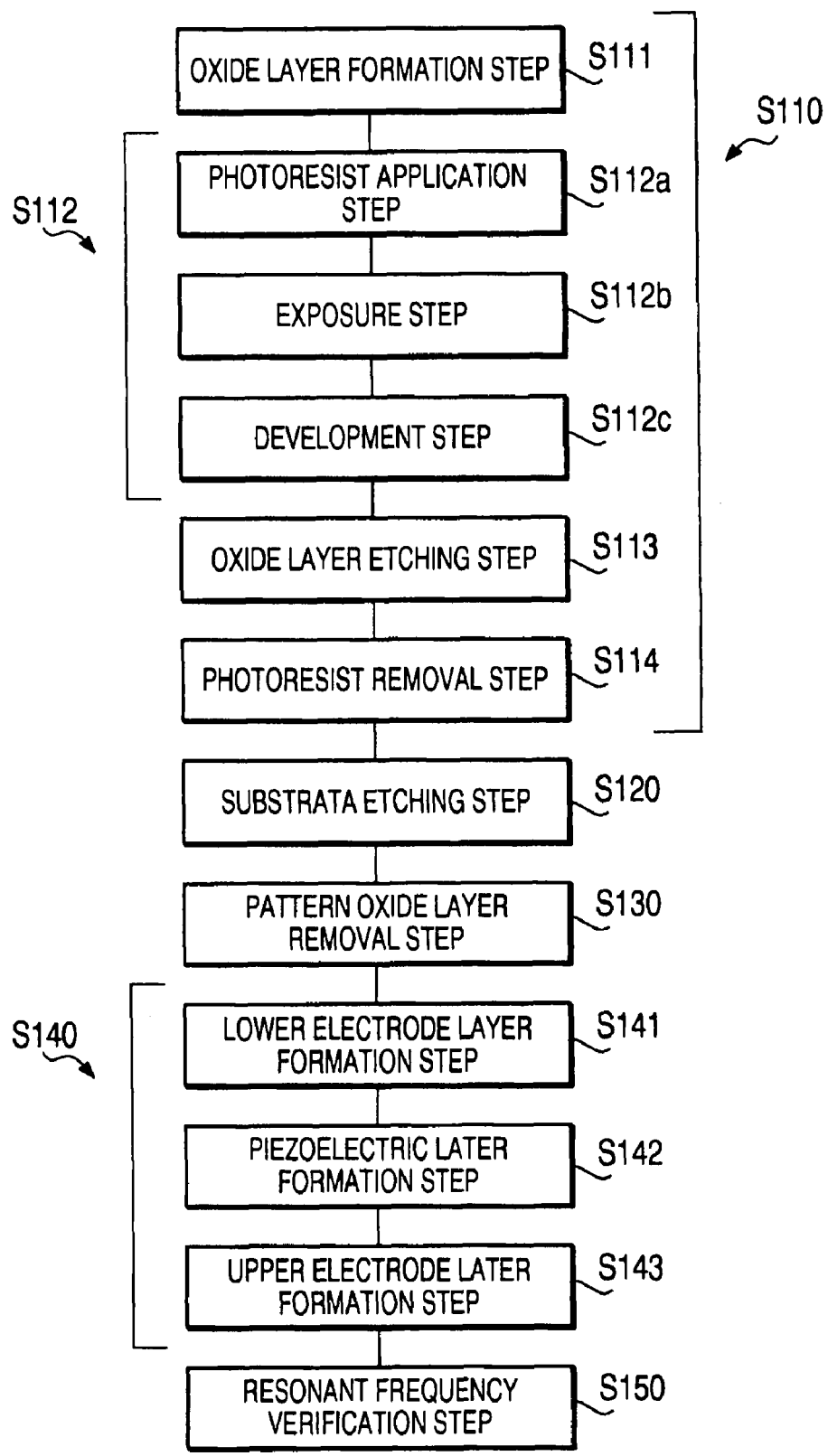

FIG. 15 is a fabrication process view of a fourth embodiment.

Figure 16:
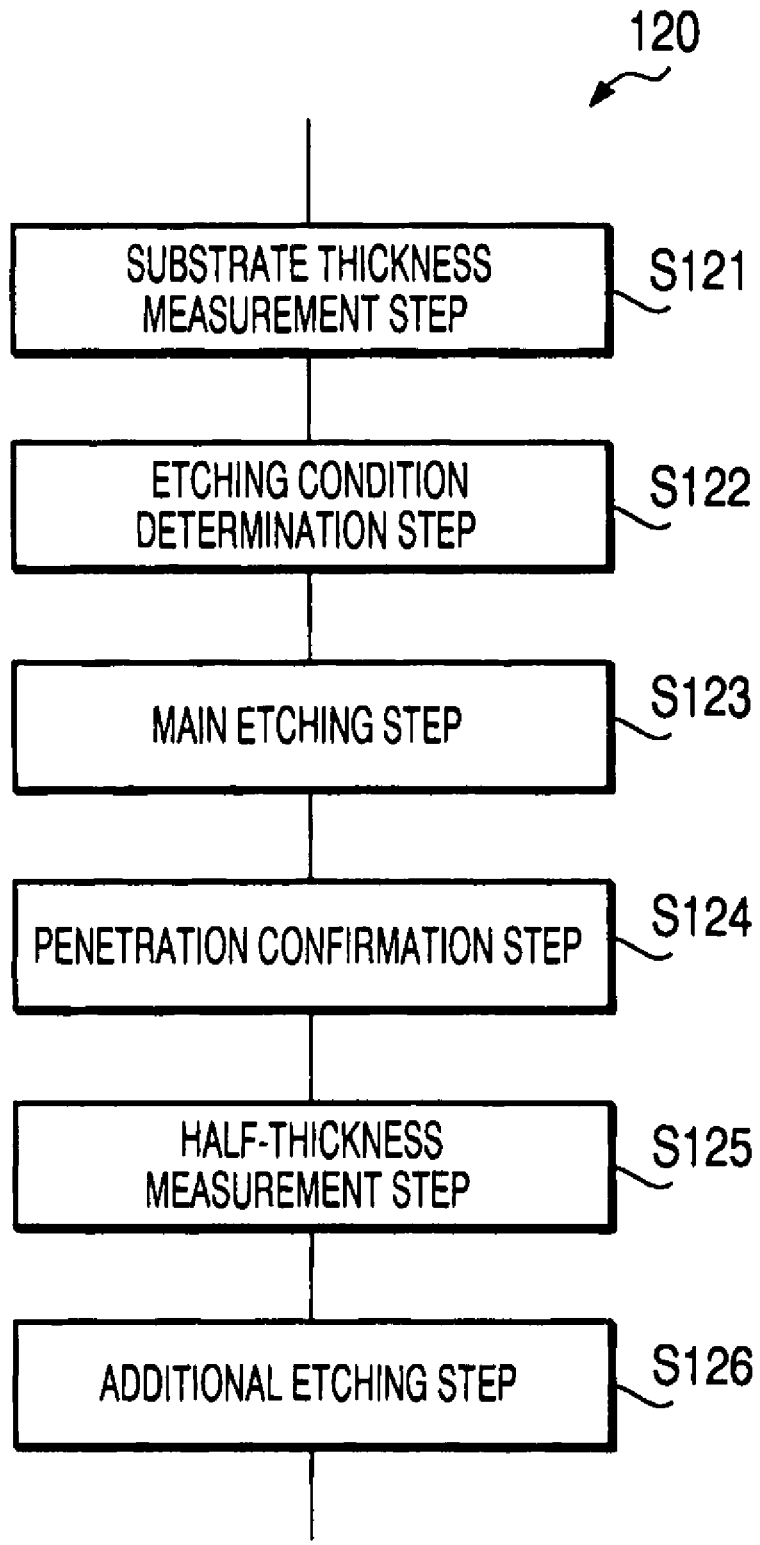

FIG. 16 is a detailed process view of a substrate etching step shown in FIG. 15.

FIGS. 17(a) to 17(g) are sectional views showing changes in a sectional structure in the fabrication process of the fourth embodiment, taken along line B-B in FIG. 1.

FIGS. 18(a) to 18(g) are sectional views showing changes in the sectional structure in the fabrication process of the fourth embodiment, taken along line A-A in FIG. 1.

Figure 19:
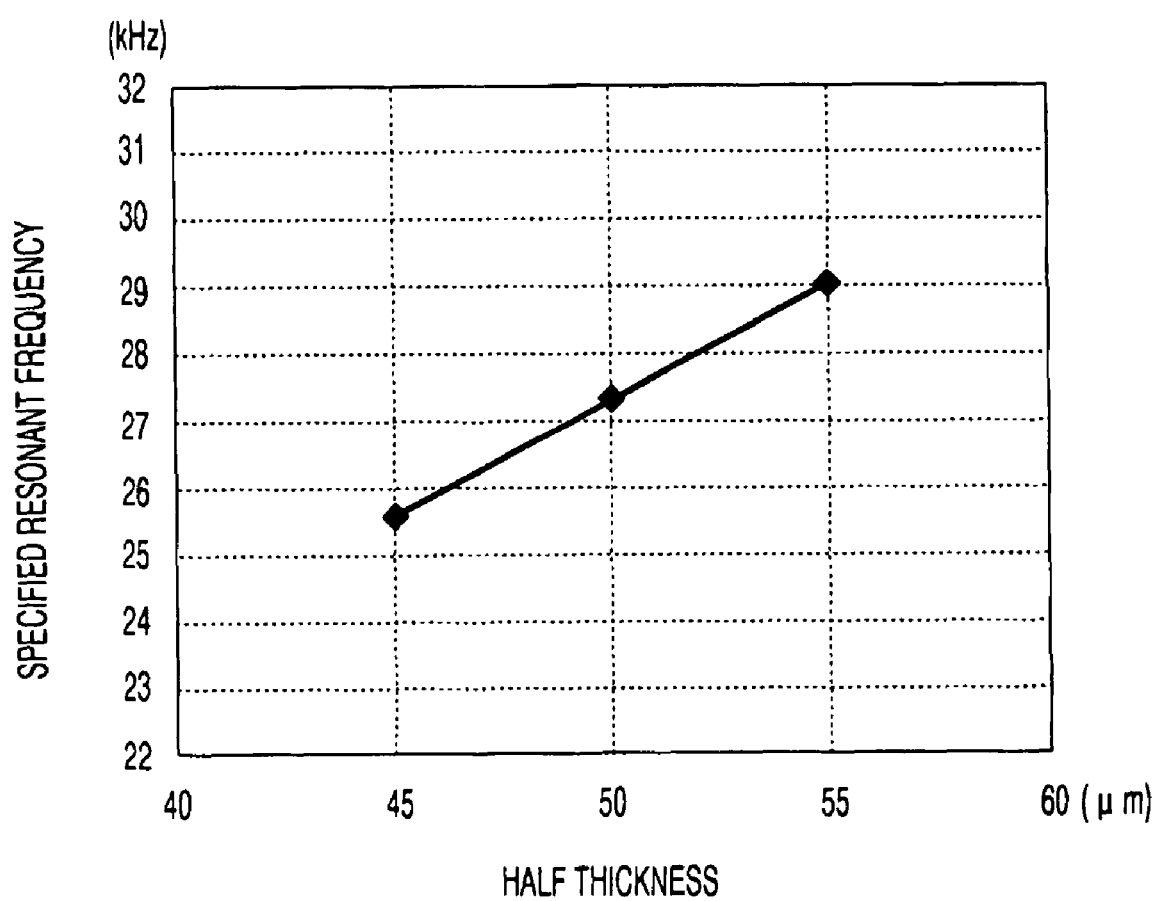

FIG. 19 is a graph showing the relationship between a specified resonant frequency and the half of thickness in the fourth embodiment.

Figure 20:
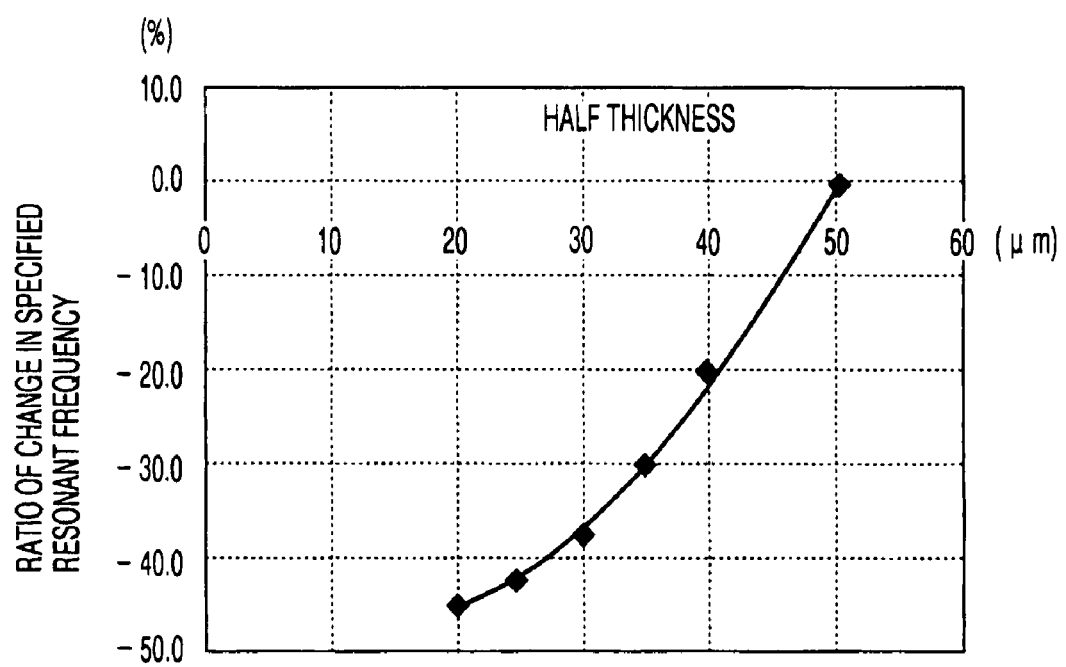

FIG. 20 is a graph showing the relationship between the ratio of change in the specified resonant frequency and the half of the thickness in the fourth embodiment.

Figure 21:
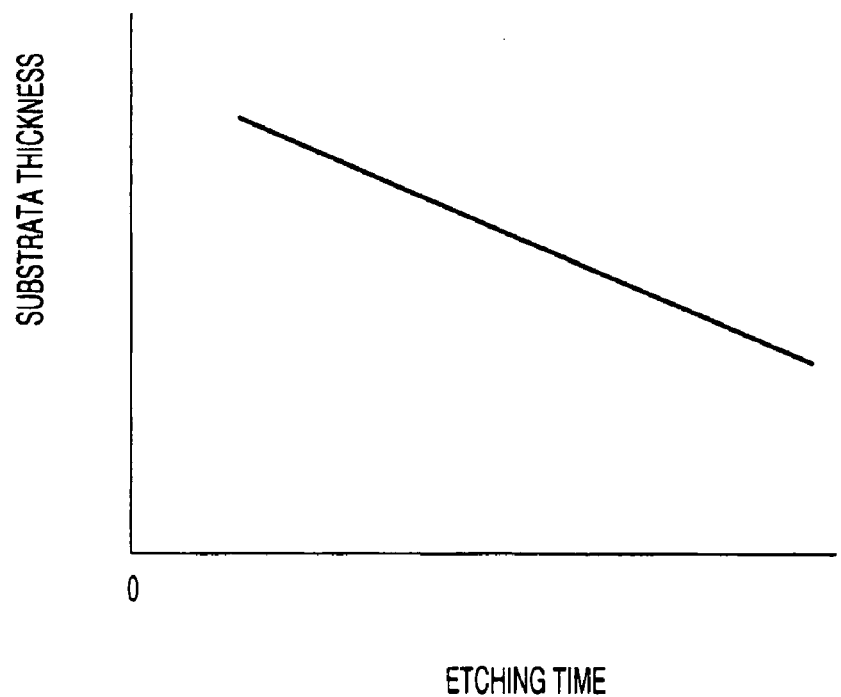

FIG. 21 is a graph showing the relationship between the thickness of a substrate and an etching time in the fourth embodiment.

Figure 22:
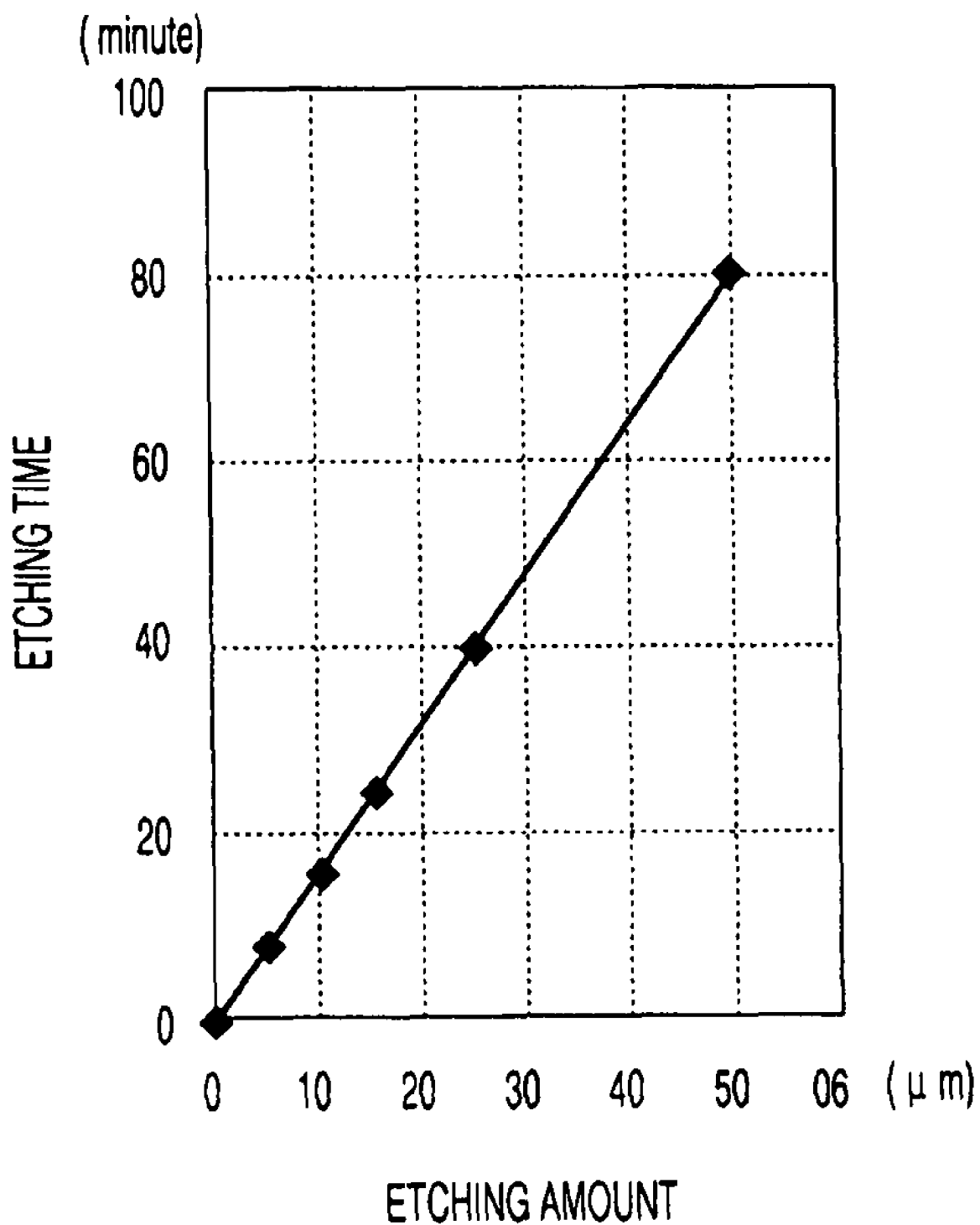

FIG. 22 is a graph showing the relationship between the etching time and an etching amount in the fourth embodiment.

Figure 23:
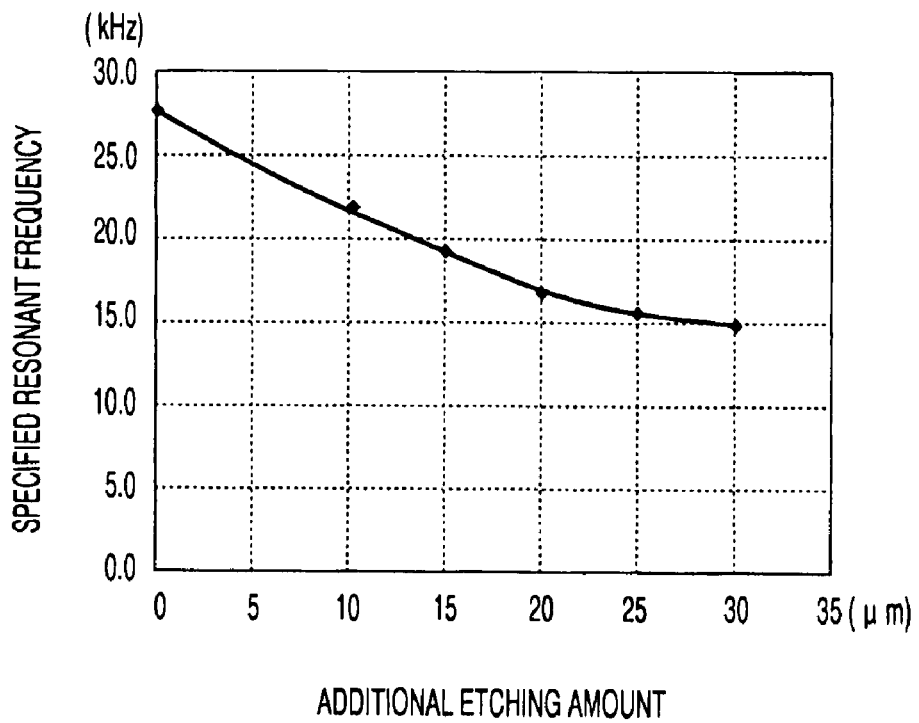

FIG. 23 is a graph showing the relationship between the specified resonant frequency and an additional etching amount in the fourth embodiment.

Figure 24:
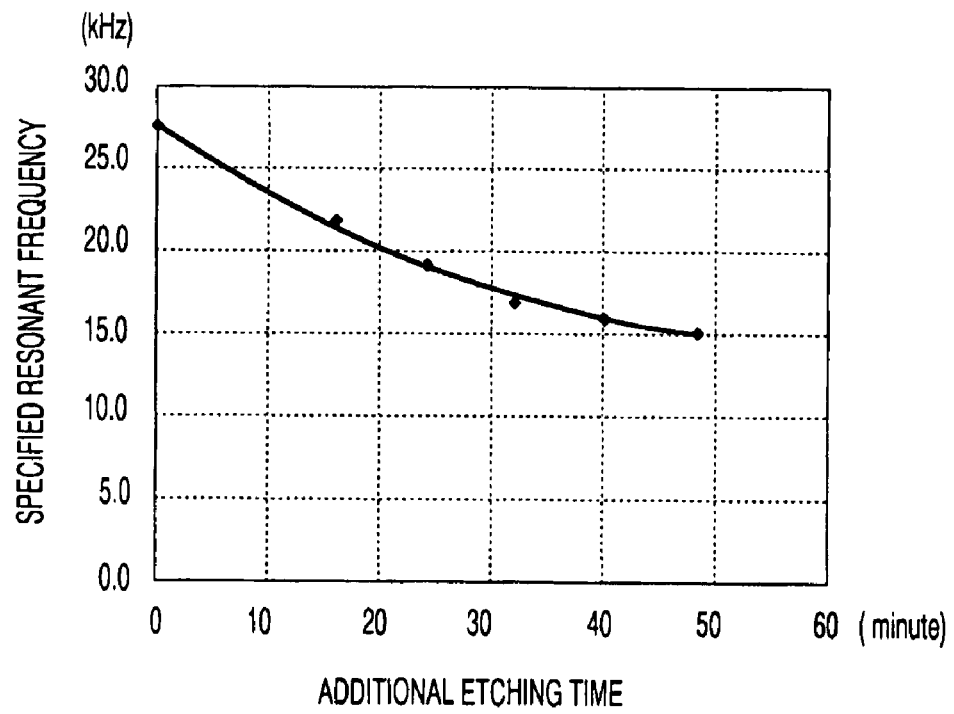

FIG. 24 is a graph showing the relationship between the specified resonant frequency and an additional etching time in the fourth embodiment.

DETAILED DESCRIPTION

Embodiments of the present invention will be described below with reference to the drawings.

First Embodiment

A first embodiment of the present invention will be described below. FIG. 1 is a perspective view showing the structure of an optical scanner 200 to which a fabrication method of a first embodiment of the present invention is applied. The optical scanner 200 is fabricated to have the structure shown in FIG. 1, by micromachining technology. The optical scanner 200 has a loop-shaped sheet frame 10, two pairs of beams 20, a disc-like reflecting mirror 30, and two pairs of piezoelectric elements 40. The obliquely upper left and the obliquely lower right in FIG. 1 correspond to the left side and the right side of the optical scanner 200 respec- tively. The obliquely upper right and the obliquely lower left correspond to the front side and the rear side of the optical scanner 200 respectively.

The loop-shaped frame 10 has a loop-shaped outer frame 10a and a loop-shaped inner frame 10b. The loop-shaped outer frame 10a is integrally formed by left and right side portions 11 and front and rear side portions 12 and is shaped like a square.

The loop-shaped inner frame 10b is disposed inside the loop-shaped outer frame 10a and is formed integrally with the outer frame 10a. The loop-shaped inner frame 10b has left and right central thick-wall portions 13 and front and back U-shaped thin-wall portions 14. The thick-wall portions 13 face with each other, extending internally from the longitu- dinal central portions of the left and right side portions 11 of the outer frame 10a. The thick-wall portions 13 have the same thickness as the outer frame 10a.

Each of the front and back thin-wall portions 14 is shaped like a letter "U" with two side portions 14a and one connec- tion portion 14b, as shown in FIG. 1. The front and back thin-wall portions 14 are formed flush with the bottom surface of the outer frame 10a and seat below the top surface of the outer frame 10a because of their smaller thickness. The side portions 14a of the front thin-wall portion 14 face the side portion 14a of the back thin-wall portion 14 through the left and right central thick-wall portions 13.

The two pairs of beams 20 extend from the longitudinal central positions of the connection portions 14b of the front and back thin-wall portions 14 toward the inside and face with each other. Of the two pairs of beams 20, the pair of front beams 20 integrally extend from the longitudinal central posi- tion of the connection portion 14b of the front thin-wall portion 14. The pair of back beams 20 integrally extend from the longitudinal central position of the connection portion 14b of the back thin-wall portion 14 toward the pair of front beams 20.

The left beam and the right beam of the pair of front beams 20 are aligned with the left beam and the right beam of the pair of back beams 20 respectively. The two pairs of beams 20 have the same thickness as the thin-wall portion 14, and the two pairs of beams 20 have the same width and the same length.

The reflecting mirror 30 is integrally supported by and coupled to the two pairs of beams 20 through front and back coupling elements 50. More specifically, the front and back coupling elements 50 in the coupling support structure are symmetric with respect to the reflecting mirror 30 in the front and back directions, and each of the front and back coupling elements 50 has a U-shaped leg portion 52 extending from the longitudinal central position of a head portion 51.

The head portion 51 of the front coupling element 50 extends from the reflecting mirror 30 toward the front along the front-and-back-direction axis, and the two ends of the U-shaped leg portion 52 of the front coupling element 50 are coupled to and supported by the pair of front beams 20. The head portion 51 of the back coupling element 50 extends from the reflecting mirror 30 toward the back along the front-and- back-direction axis, and the two ends of the U-shaped leg portion 52 of the back coupling element 50 are coupled to and supported by the pair of back beams 20.

Consequently, the reflecting mirror 30 is integrally coupled to and supported by the two pairs of beams 20 through the coupling elements 50. The reflecting mirror 30 and the front and back coupling elements 50 have the same thickness as the outer frame 10a.

Of the two pairs of piezoelectric elements 40, the pair of front piezoelectric elements 40 are formed on an area from central portions of the connection portion 14b of the front thin-wall portion 14 to the pair of front beams 20, as shown in FIG. 1. The pair of back piezoelectric elements 40 are formed on an area from central portions of the connection portion 14b of the back thin-wall portion 14 to the pair of back beams 20, as shown in FIGS. 1 and 2.

The two pairs of piezoelectric elements 40 include piezoelectric elements having the same structure. Of the two pairs of piezoelectric elements 40, the right piezoelectric element 40 of the pair of back piezoelectric elements 40 will be taken as an example, and the structure thereof will be described with reference to FIG. 2.

Figure 2:
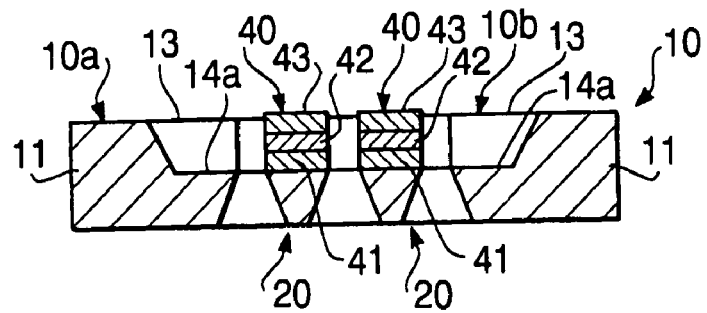
FIG. 2 is a cross sectional view taken along line A-A in FIG. 1.

The right piezoelectric element 40 includes a lower electrode 41, a piezoelectric layer 42, and an upper electrode 43, as shown in FIG. 2. In the right piezoelectric element 40, the lower electrode 41 is formed on an area from the central portion of the connection portion 14b of the back thin-wall portion 14 to the right beam 20 of the pair of back beams 20. The piezoelectric layer 42 is deposited on the lower electrode 41. The upper electrode 43 is deposited on the piezoelectric layer 42 to face the lower electrode 41 through the piezoelectric layer 42.

Like the right piezoelectric element 40 of the pair of back piezoelectric elements 40, the left piezoelectric element 40 of the pair of back piezoelectric elements 40 and the pair of front piezoelectric elements 40 also include the lower electrode 41, the piezoelectric layer 42, and the upper electrode 43. In the left piezoelectric element 40 of the pair of back piezoelectric elements 40, the lower electrode 41, the piezoelectric layer 42, and the upper electrode 43 are deposited in that order on the area from the central portion of the connection portion 14b of the back thin-wall portion 14 to the left beam 20 of the pair of back beams 20.

In the left piezoelectric element 40 of the pair of front piezoelectric elements 40, the lower electrode 41, the piezoelectric layer 42, and the upper electrode 43 are deposited in that order on the area from the central portion of the connection portion 14b of the front thin-wall portion 14 to the left beam 20 of the pair of front beams 20. In the right piezoelectric element 40 of the pair of front piezoelectric elements 40, the lower electrode 41, the piezoelectric layer 42, and the upper electrode 43 are deposited in that order on the area from the central portion of the connection portion 14b of the front thin-wall portion 14 to the right beam 20 of the pair of front beams 20.

In the optical scanner 200 structured as described above, when the pair of front piezoelectric elements 40 drives the pair of front beams 20 to have torsional vibration and when the pair of back piezoelectric elements 40 drives the pair of back beams 20 to have torsional vibration in the direction opposite to the torsional vibration of the pair of front beams 20, the reflecting mirror 30 is torsionally vibrated by the pairs of front and back beams 20 through the two coupling elements 50 at a predetermined resonant frequency. Consequently, the reflecting mirror 30 scans light entering its reflecting surface.

The method of fabricating the optical scanner structured as described above will next be described. When the optical scanner 200 is fabricated, a silicon substrate 100 (see FIG. 5(a)) is prepared. The silicon substrate 100 is one of a great number of silicon substrates to be used, and the great number of silicon substrates are supposed to vary in thickness within the range of about 90 μm to 110 μm.

Before the optical scanner 200 is fabricated, the design specifications of the optical scanner are specified. Of the design specifications, the resonant frequency of the reflecting mirror 30 is specified as follows.

Assuming that the thickness of the silicon substrate 100 does not vary and remains invariant, the thickness of the portions forming the pairs of front and back beams 20 and the front and back thin-wall portions 14 of the inner frame 10b should be brought to a half (hereinafter also referred to as a half thickness) of the thickness of the silicon substrate 100, in order to give desired characteristics to the optical scanner 200.

When the resonant frequency of the reflecting mirror 30 of the optical scanner 200 is specified, the following equation (1) is used:

$$Fo = (1/2\pi) \cdot (K/I)^{1/2} \tag{1}$$

In this equation (1), "Fo" is the predetermined resonant frequency of the reflecting mirror 30. "K" is the modulus of elasticity of the portions forming the pair of beams 20 in the silicon substrate 100. "I" is the moment of inertia of the portion forming the reflecting mirror 30 in the silicon substrate 100.

The modulus of elasticity "K" and the moment of inertia "I" can be given by the following equations (2) and (3) respectively.

$$K = 2 \cdot \kappa \cdot a \cdot b^3 \cdot G/L \tag{2}$$

$$I = M \cdot D^2 / 12 \tag{3}$$

In the equation (2), "a", "b", and "L" are the width, thickness, and length of the beam 20 respectively. κ is the modulus of section of the beam 20. "G" is the torsional rigidity of the silicon substrate 100. In the equation (3), "D" is the diameter of the reflecting mirror 30. "M" is the mass of the reflecting mirror 30 and is given by the following equation (4).

$$M = D^2 \cdot t \cdot \rho \tag{4}$$

In the equation (4), "t" is the thickness of the reflecting mirror 30. ρ is the density of the silicon substrate 100.

The resonant frequency "Fo" is predetermined as given by the equation (1). In the first embodiment, the great influence of the thickness "b" of the beam 20 on the specified resonant frequency "Fo" is considered in the equation (1). In the right side of the equation (1), the influence of "I" and the dimensions included in K, except for the thickness "b" of the beam 20, on the specified resonant frequency "Fo" is ignored.

The structure of the optical scanner 200 does not allow the equation (1) to be applied directly. The equation (1) can be applied after the moment of inertia "I" and the modulus of elasticity "K" are appropriately estimated. The calculation of a model by using the equation (1) is so complex that the resonant frequency is usually calculated by a simulator.

The process of fabricating the optical scanner 200 will be described with reference to FIG. 3 and FIGS. 5(a) to 5(g). FIGS. 5(a) to 5(g) are sectional views showing changes in the sectional structure of the optical scanner 200 in the fabrication process, taken along line A-A in FIG. 1.

1. Oxide Layer Formation Step

Figure 5:
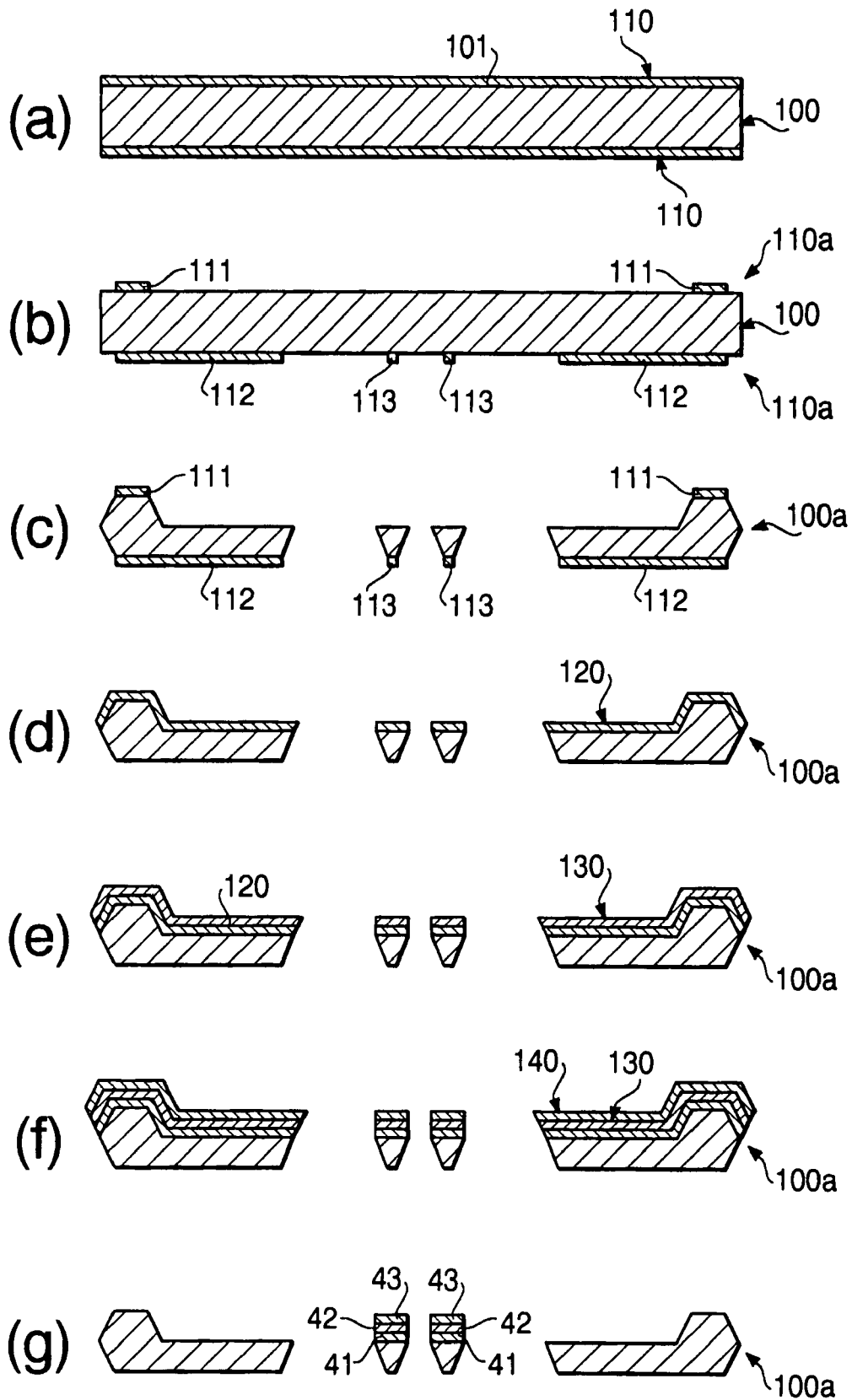

In oxide layer formation step S10, a top-surface oxide layer 110 is formed on the top surface 101 of the silicon substrate 100, and a bottom-surface oxide layer 110 is formed on the bottom surface 102 of the silicon substrate 100 (FIG. 5(a)).

2. Patterning Step

In patterning step S20, resist layers are provided on the two oxide layers 110, photolithography and etching are performed, and then, the resist layers are removed from the oxide layers 110. Now, the two oxide layers 110 become oxide pattern layers 110a (see FIG. 5(b)).

In FIG. 5(b), the reference numerals 111 denote the cross sections of the top-surface oxide pattern layer 110a, taken along line A-A in FIG. 1. The reference numerals 112 and 113 denote the cross sections of the bottom-surface oxide pattern layer 110a, taken along line A-A in FIG. 1. The cross sections denoted by the reference numerals 111 and 112 correspond to the cross-sections of the rear side of the frame 10 of the optical scanner 200. The cross sections denoted by the reference numerals 113 correspond to the cross sections of the pair of back beams 20 of the optical scanner 200.

3. Etching Step

In etching step S30, anisotropic wet etching is performed on the silicon substrate 100 through the two oxide pattern layers 110a.

In the wet etching, the silicon substrate 100 is wet-etched from its top surface through the top-surface oxide pattern layer 110a. Accordingly, the portions of the silicon substrate 100 without the top-surface oxide pattern layer 110a are wet-etched from the top surface.

Further, the silicon substrate 100 is wet-etched from its bottom surface through the bottom-surface oxide pattern layer 110a. Accordingly, the portions of the silicon substrate 100 without the bottom-surface oxide pattern layer 110a are wet-etched from the bottom surface.

The two oxide pattern layers 110a have different pattern shapes. Accordingly, the portions of the silicon substrate 100 without the top-surface oxide pattern layer 110a are wet-etched to the bottom surface of the silicon substrate 100. In this embodiment, the portions of the silicon substrate 100 without the top-surface oxide pattern layer 110a (hereafter referred to as half portions) are wet-etched to a half of the thickness of the silicon substrate 100. Now, the silicon substrate 100 is formed as an etching substrate 100a (see FIG. 5(c)).

4. Oxide Layer Pattern Removal Step

Then, in oxide pattern layer removal step S40, the two oxide pattern layers 110a are removed from the etching substrate 100a.

5. Piezoelectric-Element Formation Step

Figure 3:
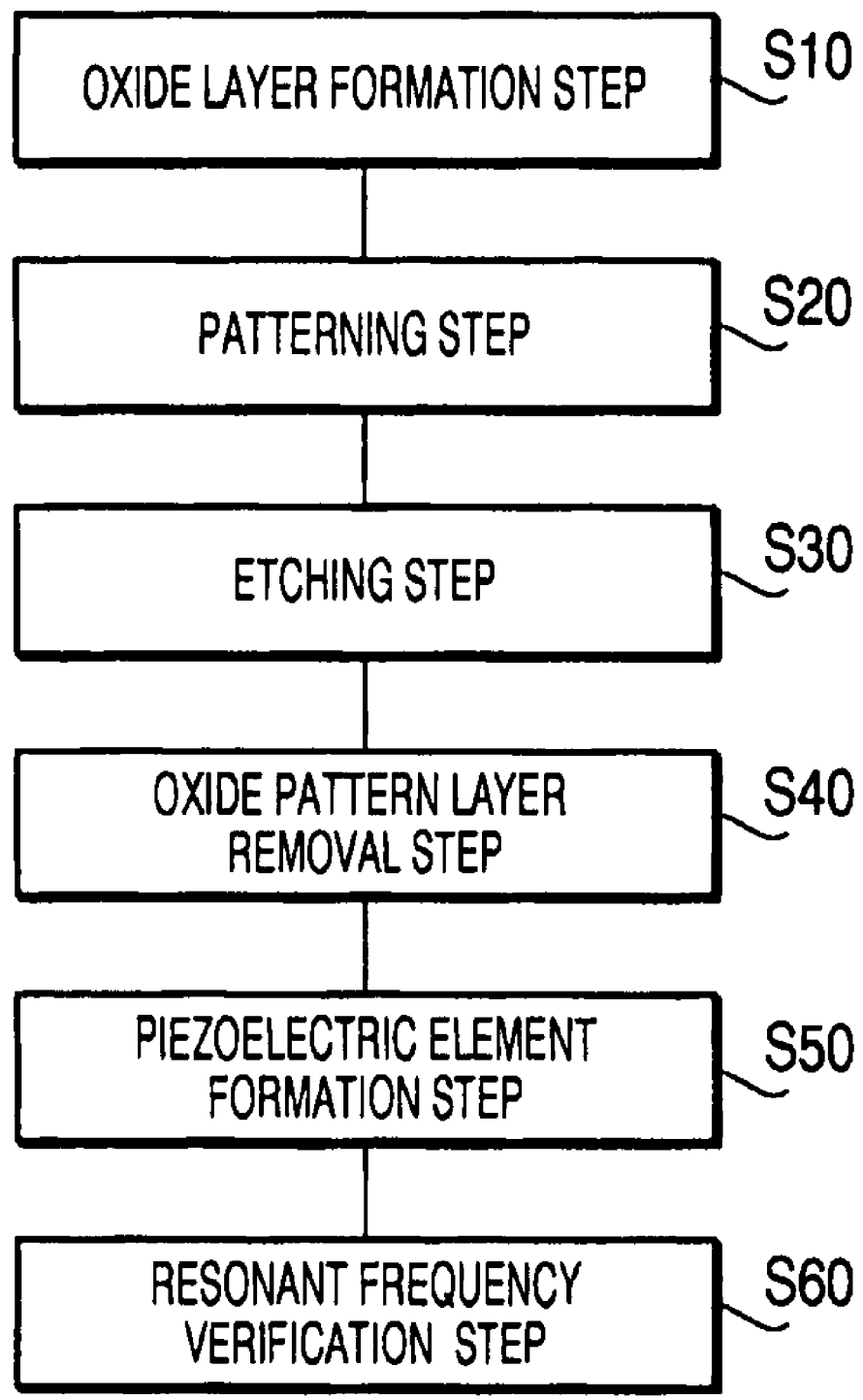
FIG. 3 is a view showing a fabrication process of the first embodiment.
Figure 4:
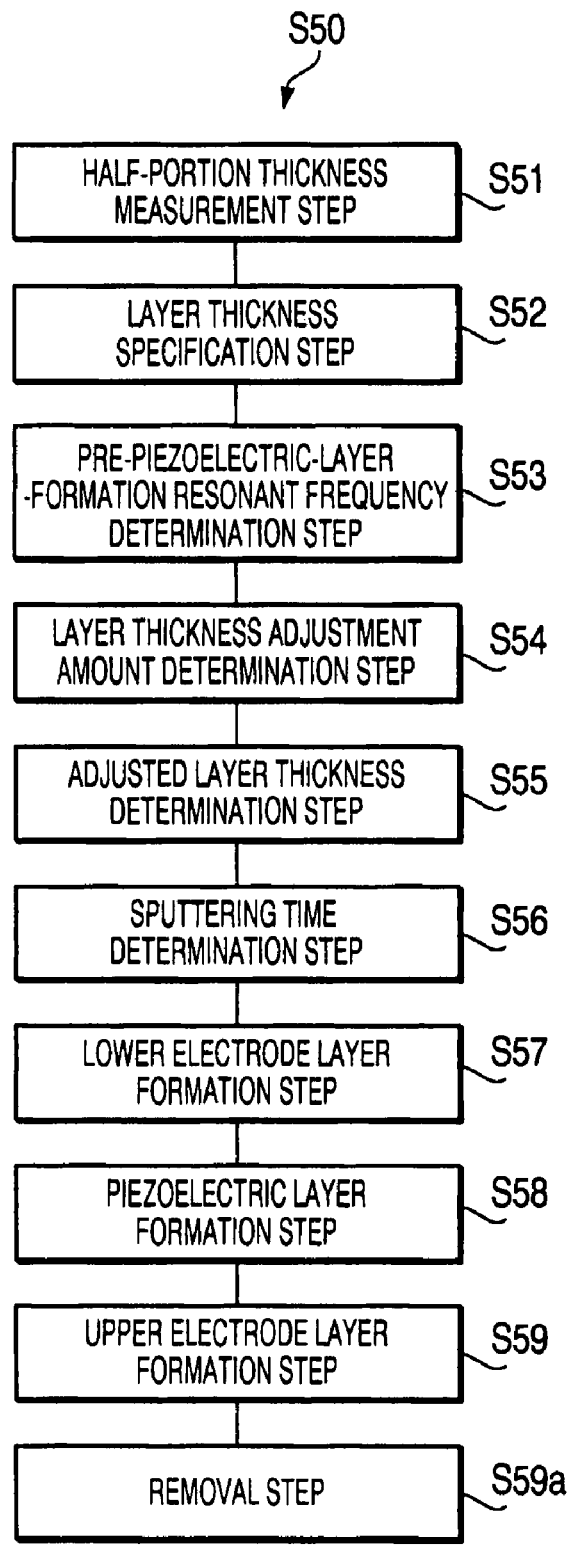
FIG. 4 is a detailed process view showing a piezoelectric-element formation step shown in FIG. 3.

Piezoelectric-element formation step S50 will next be described (see FIGS. 3 and 4). In half-portion thickness measurement step S51, the thickness of each half portion (half thickness) is measured by a stylus method in the etching substrate 100a. The thickness of each half portion may be measured by a film thickness gauge using a mercury lamp, which is usually used in the semiconductor fabrication inspection step, or a laser-scanning film thickness gauge, instead of the stylus method.

In layer thickness specification step S52, the layer thickness of the piezoelectric layer 42 of each piezoelectric element 40 is specified. For this specification step, the inventor and his colleagues checked the relationship between the layer thickness "t" of the piezoelectric layer and the specified resonant frequency "Fo" in accordance with variations in the thickness of the silicon substrate and obtained the characteristics shown in the graph of FIG. 6. These characteristics will be hereafter referred to as the layer thickness versus specified resonant frequency characteristics of the piezoelectric layer.

In the first embodiment, the layer thickness "t" of the piezoelectric layer 42 (hereafter also referred to as specified layer thickness "t") is specified depending on the specified resonant frequency "Fo", in accordance with the layer thickness versus specified resonant frequency characteristics of the piezoelectric layer. For instance, when the specified resonant frequency "Fo" is 26.0 kHz, the corresponding layer thickness "t" is 1.0 μm, in accordance with the layer thickness versus specified resonant frequency characteristics of the piezoelectric layer shown in FIG. 6.

In pre-piezoelectric-layer-formation resonant frequency determination step S53, the resonant frequency of the reflecting mirror 30 of the optical scanner 200 after oxide layer pattern removal step S40 and before piezoelectric layer formation is determined.

For this determination step, the inventor and his colleagues checked the relationship between the resonant frequency (hereafter referred to as pre-layer-formation resonant frequency "f") of the reflecting mirror 30 of the optical scanner 200 after the oxide layer pattern is removed and before the piezoelectric layer is formed and the thickness of the half portion (half thickness), and obtained the characteristics shown in the graph of FIG. 7. These characteristics will be hereafter referred to as the pre-piezoelectric-layer-formation resonant frequency versus half thickness characteristics.

In the first embodiment, the pre-layer-formation resonant frequency "f" is determined from the half thickness measured in half-portion thickness measurement step S51, in accordance with the pre-piezoelectric-layer-formation resonant frequency versus half thickness characteristics. When the thickness of the half portion is 45.0 μm, the corresponding pre-layer-formation resonant frequency "f" is 25.0 kHz, in accordance with the pre-piezoelectric-layer-formation resonant frequency versus half thickness characteristics, shown in FIG. 7.

When the processing in pre-piezoelectric-layer-formation resonant frequency determination step S53 ends, a layer-thickness adjustment amount of the piezoelectric layer is determined in layer thickness adjustment amount determination step S54.

For the determination step, the inventor and his colleagues checked how the difference between the specified resonant frequency "Fo" and the pre-layer-formation resonant frequency "f" affects the specified layer thickness "t". More specifically, the layer thickness adjustment amount $\Delta t$ of the piezoelectric layer caused by the frequency difference amount $\Delta F$ between the specified resonant frequency "Fo" and the pre-layer-formation resonant frequency "f" was studied in consideration of variations in the thickness of the silicon substrate.

The characteristics between the layer thickness adjustment amount $\Delta t$ of the piezoelectric layer and the frequency difference $\Delta F$ were obtained as shown in the graph of FIG. 8. The characteristics will be referred to as the layer thickness adjustment amount versus frequency difference amount characteristics of the piezoelectric layer.

In the first embodiment, the frequency difference amount $\Delta F$ between the specified resonant frequency "Fo" and the pre-layer-formation resonant frequency "f" is calculated, and the layer thickness adjustment amount $\Delta t$ is determined by using the frequency difference amount $\Delta F$ in accordance with the layer thickness adjustment amount versus frequency difference amount characteristics of the piezoelectric layer.

For instance, when the specified resonant frequency "Fo" and the pre-layer-formation resonant frequency "f" are 26.0 kHz and 25.0 kHz respectively, the frequency difference amount $\Delta F$ is 26.0−25.0=1.0 kHz. When the frequency difference amount $\Delta F$ is 1.0 kHz, the layer thickness adjustment amount $\Delta t$ of the piezoelectric layer is 1.1 μm, in accordance with the layer thickness adjustment amount versus frequency difference amount characteristics of the piezoelectric layer in FIG. 8.

In adjusted layer thickness determination step S55, the adjusted layer thickness of the piezoelectric layer is determined. When the value is determined, if the specified resonant frequency "Fo" is greater than the pre-layer-formation resonant frequency "f", Fo−f (corresponding to the layer thickness adjustment amount Δt) must be added to the pre-layer-formation resonant frequency "f" in order to adjust the pre-layer-formation resonant frequency "f" to the specified resonant frequency "Fo". Consequently, the adjusted layer thickness "to" equals t+Δt.

If the specified resonant frequency "Fo" is smaller than the pre-layer-formation resonant frequency "f", f−Fo (corresponding to the layer thickness adjustment amount Δt) must be subtracted from to the pre-layer-formation resonant frequency "f" in order to adjust the pre-layer-formation resonant frequency "f" to the specified resonant frequency "Fo". Consequently, the adjusted layer thickness "to" equals t−Δt. If Fo=f, Δt=0, therefore t=to.

For instance, when the specified resonant frequency "Fo" and the pre-layer-formation resonant frequency "f" are 26.0 kHz and 25.0 kHz respectively, Fo>f and ΔF is 26.0−25.0=1.0 kHz. Accordingly, when the specified layer thickness "t" is 1.0 μm and the layer thickness adjustment amount Δt is 1.1 μm, Δt of 1.1 μm must be added to t=1.0 μm. Consequently, the adjusted layer thickness is determined to be 2.1 μm.

In sputtering time determination step S56, a sputtering time "Ts" needed to form the piezoelectric layer is determined. In the determination step, the characteristics representing the relationship between the sputtering time "Ts" and the adjusted layer thickness "to" (hereafter referred to as the sputtering time versus adjusted layer thickness characteristics) as shown in FIG. 9 are used. The sputtering time "Ts" is determined from the adjusted layer thickness "to" in accordance with the sputtering time versus adjusted layer thickness characteristics. If an approximately linear part of the graph in FIG. 9 is used, the sputtering time "Ts" is determined as a proportional value by using the adjusted thickness value "to".

When the processing of half-portion thickness measurement step S51 to sputtering time determination step S56 ends, a lower electrode layer 120 is formed across the entire surface of the etching substrate 100a in lower electrode layer formation step S57 (see FIG. 5(d)).

In piezoelectric layer formation step S58, a piezoelectric layer 130 is formed on the whole of the lower electrode layer 120 as described below (see FIG. 5(e)).

Sputtering using a piezoelectric material on the lower electrode layer 120 for the sputtering time "Ts", determined as described above, forms the piezoelectric layer 130. The sputtering is performed for the sputtering time "Ts" while the distance between the target and the etching substrate 100a is kept constant. This forms the piezoelectric layer 130 having the adjusted thickness "to".

In upper electrode layer formation step S59, an upper electrode layer 140 is formed on the piezoelectric layer 130 by gold (Au) sputtering (see FIG. 5(f)).

After the layers are formed, portions of the upper electrode layer 140, the piezoelectric layer 130, and the lower electrode layer 120, not corresponding to the surfaces of the beams 20 are removed in removal step S59a (see FIG. 5(g)). Then, the upper electrode layer 140, the piezoelectric layer 130, and the lower electrode layer 120 are formed as the upper electrode 43, the piezoelectric layer 42, and the lower electrode 41 respectively on each of the beams 20. Consequently, the piezoelectric elements 40 are formed on the corresponding beams 20, and the fabrication of the optical scanner 200 is completed.

6. Resonant Frequency Verification Step

In resonant frequency verification step S60 (see FIG. 3), the optical scanner 200 fabricated as described above is driven, and the resonant frequency of the reflecting mirror 30 is verified. If the verification step indicates that the resonant frequency of the optical scanner fabricated as described above matches the specified resonant frequency "Fo", the optical scanner 200 is considered to be acceptable. Now, the optical scanner fabrication process is completed.

As described above, in the first embodiment, the layer thickness "t" is specified depending on the specified resonant frequency "Fo" in accordance with the layer thickness versus specified resonant frequency characteristics of the piezoelectric layer (see FIG. 6); the pre-piezoelectric-layer-formation resonant frequency "f" is determined from the thickness of the half portion measured after etching of the silicon substrate 100, in accordance with the pre-piezoelectric-layer-formation resonant frequency versus half thickness characteristics (see FIG. 7); the layer thickness adjustment amount Δt of the piezoelectric layer is determined from the frequency difference amount in accordance with the layer thickness adjustment amount versus frequency difference amount characteristics of the piezoelectric layer (see FIG. 8), and the adjusted layer thickness "to" is determined from the specified layer thickness "t" and the layer thickness adjustment amount Δt; and the sputtering time "Ts" is determined from the adjusted layer thickness "to" in accordance with the sputtering time versus adjusted layer thickness characteristics (see FIG. 9). Then, a piezoelectric layer having the adjusted layer thickness "to" is formed by sputtering for the sputtering time "Ts" in the piezoelectric-element formation step, as described above.

With the layer thickness of the piezoelectric layer specified to the adjusted layer thickness "to", the resonant frequency of the optical scanner 200 can be adjusted to the specified resonant frequency "Fo" with high precision in the piezoelectric-element formation step, even if the thickness of the silicon substrate varies. This eliminates the need for etching the silicon substrate again to obtain the specified resonant frequency "Fo" after the test in the resonant frequency verification step. Consequently, the process of fabricating the optical scanner 200 does not require any additional step and can adjust the resonant frequency of the optical scanner 200 to the specified resonant frequency "Fo" with high precision.

The specified resonant frequency "Fo" is obtained by adjusting the layer thickness of the piezoelectric layer in the piezoelectric-element formation step, as described above. Accordingly, the optical scanner 200 can be fabricated adequately with inexpensive general-purpose silicon substrates, usually varying in thickness.

Second Embodiment

A second embodiment of the present invention will be described below. In the second embodiment, the optical scanner 200 is fabricated, in consideration of the thickness of the reflecting mirror 30 and the dimensions in the right side of the equation (1) described in the first embodiment, except for the thickness "b" of the beam 20. Distinctive characteristics of the second embodiment will next be described.

In the second embodiment, the following is performed in piezoelectric-element formation step S50, which was described in the first embodiment.

In half-portion thickness measurement step S51, the thickness of a portion forming the reflecting mirror 30 of the etching substrate 100a (hereafter referred to as the mirror forming portion thickness) is measured in addition to the thickness of each half portion of the etching substrate 100a. The thickness of the reflecting mirror 30 is as thick as the silicon substrate 100, as described in the first embodiment.

In layer thickness specification step S52, the layer thickness "t" of the piezoelectric layer is determined from the specified resonant frequency "Fo" in accordance with the layer thickness versus specified resonant frequency characteristics of the piezoelectric layer shown in FIG. 6, as described in the first embodiment.

In pre-piezoelectric-layer-formation resonant frequency determination step S53, the resonant frequency of the reflecting mirror 30 of the optical scanner 200 after oxide pattern layer removal step S40 and before piezoelectric layer formation is determined in consideration of the characteristics indicating the relationship between the pre-piezoelectric-layer-formation resonant frequency and the mirror forming portion thickness (see FIG. 10) in addition to the pre-piezoelectric-layer-formation resonant frequency versus half thickness characteristics (see FIG. 7).

The characteristics indicating the relationship between the pre-piezoelectric-layer-formation resonant frequency and the mirror forming portion thickness (hereafter referred to as the pre-piezoelectric-layer-formation resonant frequency versus mirror forming portion thickness characteristics) are shown in the graph of FIG. 10.

In the second embodiment, the pre-layer-formation resonant frequency is obtained from the measured thickness of the mirror forming portion in accordance with the pre-piezoelectric-layer-formation resonant frequency versus mirror forming portion thickness characteristics. For instance, the pre-layer-formation resonant frequency of the second embodiment is obtained by adding a certain part of the pre-layer-formation resonant frequency to the pre-layer-formation resonant frequency obtained from the pre-piezoelectric-layer-formation resonant frequency versus half thickness characteristics. On the basis of the determined pre-layer-formation resonant frequency, layer thickness adjustment amount determination step S54 and sputtering time determination step S56, which were described in the first embodiment, are performed.

In the second embodiment, the specified resonant frequency "Fo" is determined in consideration of the thickness of the reflecting mirror 30 in addition to the thickness of the beams 20. As a result, the fabricated optical scanner can provide the specified resonant frequency "Fo" with higher precision than in the first embodiment.

Third Embodiment

A third embodiment will next be described. In the third embodiment, the optical scanner 200 is fabricated in consideration of the width and length of the beams 20, the width or length (diameter) of the reflecting mirror 30, and the dimensions in the right side of the equation (I) described in the first embodiment except for the thickness "b" of the beams 20. Distinctive characteristics of the third embodiment will be described.

In the third embodiment, the following is performed in piezoelectric-element formation step S50, which was described in the first embodiment.

In half-portion thickness measurement step S51, described above, the width and length of the portion forming the beams 20 in the etching substrate 100a (hereafter referred to as a beam forming portion width and a beam forming portion length) and the diameter of the portion forming the reflecting mirror 30 in the etching substrate 100a (hereafter referred to as a mirror forming portion diameter) are measured in addition to the thickness of each half portion in the etching substrate 100a.

In layer thickness specification step S52, the layer thickness "t" of the piezoelectric layer is determined from the specified resonant frequency "Fo" in accordance with the layer thickness versus specified resonant frequency characteristics of the piezoelectric layer, shown in FIG. 6, in the same way as described in the first embodiment.

After the specification step, the resonant frequency of the reflecting mirror 30 of the optical scanner 200 after oxide pattern layer removal step S40 and before the piezoelectric layer formation is determined in pre-piezoelectric-layer-formation resonant frequency determination step S53, described above, in consideration of pre-layer-formation resonant frequency versus beam forming portion width characteristics (see FIG. 11), pre-layer-formation resonant frequency versus beam forming portion length characteristics (see FIG. 12), and pre-layer-formation resonant frequency versus mirror forming portion diameter characteristics (see FIG. 13), in addition to the pre-piezoelectric-layer-formation resonant frequency versus half thickness characteristics (see FIG. 7).

The pre-layer-formation resonant frequency versus beam forming portion width characteristics shown in FIG. 11 represent the relationship between the pre-layer-formation resonant frequency of the piezoelectric layer described above and the beam forming portion width. The pre-layer-formation resonant frequency versus beam forming portion length characteristics shown in FIG. 12 represent the relationship between the pre-layer-formation resonant frequency of the piezoelectric layer described above and the beam forming portion length. The pre-layer-formation resonant frequency versus mirror forming portion diameter characteristics shown in FIG. 13 represent the relationship between the pre-layer-formation resonant frequency of the piezoelectric layer described above and the mirror forming portion diameter.

The pre-layer-formation resonant frequency, which is determined in consideration of the thickness of the reflecting mirror 30 in the second embodiment, is determined in the third embodiment, as follows: The pre-layer-formation resonant frequency is determined from the measured width of the beam forming portion in accordance with the pre-layer-formation resonant frequency versus beam forming portion width characteristics; the pre-layer-formation resonant frequency is determined from the measured length of the beam forming portion in accordance with the pre-layer-formation resonant frequency versus beam forming portion length characteristics; and the pre-layer-formation resonant frequency is determined from the measured diameter of the mirror forming portion in accordance with the pre-layer-formation resonant frequency versus mirror forming portion diameter characteristics. The pre-layer-formation resonant frequency obtained from the pre-piezoelectric-layer-formation resonant frequency versus half thickness characteristics is adjusted in consideration of the influence of the beam forming portion width, the beam forming portion length, and the mirror forming portion diameter on the specified resonant frequency "Fo". The adjusted pre-layer-formation resonant frequency is determined as the pre-layer-formation resonant frequency in the third embodiment. On the basis of the determined pre-layer-formation resonant frequency, layer thickness adjustment amount determination step S54 and sputtering time determination step S56, which were described in the first embodiment, are performed.

In the third embodiment, the specified resonant frequency "Fo" is determined in consideration of the width and length of the beams 20 and the diameter of the reflecting mirror 30 in addition to the thickness of the beams 20. Consequently, the fabricated optical scanner has the specified resonant frequency "Fo" with higher precision than in the first embodiment.

The present invention is not limited to the embodiment described above, and a variety of modifications of the embodiment can be configured as follows:

(1) In the third embodiment, the pre-layer-formation resonant frequency may be determined in consideration of the thickness of the reflecting mirror 30, which was described in the second embodiment, as well. Consequently, the fabricated optical scanner has the specified resonant frequency "Fo" with higher precision than in the second embodiment.

(2) If the reflecting mirror 30 in the third embodiment is not shaped like a disc but shaped like a rectangular sheet, the mirror forming portion diameter of the pre-layer-formation resonant frequency versus mirror forming portion diameter characteristics (see FIG. 13) is replaced by the mirror forming portion width, and characteristics indicating the relationship between the pre-layer-formation resonant frequency and the mirror forming portion length (see FIG. 14) are used. The characteristics are referred to as the pre-layer-formation resonant frequency versus mirror forming portion length characteristics.

In this modification, the pre-layer-formation resonant frequency is obtained from the measured width and measured length of the mirror forming portion in accordance with the pre-layer-formation resonant frequency versus mirror forming portion width characteristics and the pre-layer-formation resonant frequency versus mirror forming portion length characteristics, instead of the pre-layer-formation resonant frequency versus mirror forming portion diameter characteristics. The pre-layer-formation resonant frequency obtained from the pre-piezoelectric-layer-formation resonant frequency versus half thickness characteristics is adjusted in consideration of the influence of the width and length of the mirror forming portion, instead of the diameter of the mirror forming portion, on the specified resonant frequency "Fo". The adjusted pre-layer-formation resonant frequency is determined as the pre-layer-formation resonant frequency. On the basis of the determined pre-layer-formation resonant frequency, layer thickness adjustment amount determination step S54 and sputtering time determination step S56, which were described in the first embodiment, are performed. Consequently, the fabricated optical scanner has the specified resonant frequency "Fo" with higher precision than in the third embodiment.

(3) Half-portion thickness measurement step S51 to sputtering time determination step S56 may be performed after lower electrode layer formation step S57.

(4) Pre-piezoelectric-layer-formation resonant frequency determination step S53 may be performed after lower electrode layer formation step S57 such that the sputtering time "Ts" is determined from the layer thickness adjustment amount Δt, which is determined by the frequency difference amount ΔF between the pre-layer-formation resonant frequency obtained in the determination step and the specified resonant frequency "Fo".

(5) The piezoelectric layer of the piezoelectric element may be formed by the AD method and the like, instead of sputtering.

Several aspects of the first to third embodiments of the present invention will be summarized below. The resonant-oscillating-device fabrication method described above has the following characteristics: The resonant-oscillating-device fabrication method includes a thickness measurement step (S51) of measuring the thickness of the substrate, piezoelectric-layer formation condition determination steps (S52 to S55) of determining the conditions of forming the piezoelectric layer for bringing the frequency of the resonant oscillation of the oscillating element to a desired resonant frequency in accordance with the thickness of the substrate measured in the thickness measurement step, and piezoelectric-element formation steps (S56 to S59a) of forming the piezoelectric element in accordance with the piezoelectric-layer formation conditions determined in the piezoelectric-layer formation condition determination steps. The numbers in the parentheses following the elements are given to clarify the correspondence between each element and the corresponding specific means described in the embodiments. Those numbers are not used to limit the invention to the embodiments.

In the thickness measurement step of the resonant-oscillating-device fabrication method, the thickness of a beam forming portion of the substrate may be measured as the thickness of the substrate.

This will further improve the advantage that a desired resonant frequency can be obtained with high precision.

In the resonant-oscillating-device fabrication method, the piezoelectric-layer formation conditions determined in the piezoelectric-layer formation condition determination steps may include the layer thickness of the piezoelectric layer corresponding to the desired resonant frequency.

The advantage that a desired resonant frequency can be obtained with high precision can be improved further by including the layer thickness of the piezoelectric layer corresponding to the desired resonant frequency in the piezoelectric-layer formation conditions.

The resonant-oscillating-device fabrication method may be configured such that the thickness of the oscillating-element forming portion in the substrate is measured in addition to the thickness of the beam forming portion in the substrate in the thickness measurement step, and the layer thickness of the piezoelectric layer is determined to bring the frequency of resonant oscillation of the oscillating element to the desired resonant frequency in consideration of the thickness of the oscillating-element forming portion in addition to the thickness of the beam forming portion in the piezoelectric-layer formation condition determination step.

The layer thickness of the piezoelectric layer is determined to obtain the desired resonant frequency of the oscillating element in consideration of the thickness of the beam forming portion and also the thickness of the oscillating-element forming portion, so that the piezoelectric layer of the piezoelectric element can be formed with higher precision. As a result, the advantage that a desired resonant frequency can be obtained with high precision can be improved further.

The resonant-oscillating-device fabrication method may be configured such that the width and length of the beam forming portion and the width and length of the oscillating-element forming portion in the substrate are measured in addition to the thickness of the beam forming portion in the substrate in the thickness measurement step, and the layer thickness of the piezoelectric layer is determined to bring the frequency of resonant oscillation of the oscillating element to the desired resonant frequency in consideration of the width and length of the beam forming portion and the width and length of the oscillating-element forming portion in the substrate in addition to the thickness of the beam forming portion in the piezoelectric-layer formation condition determination step.

Because the layer thickness of the piezoelectric layer is determined to obtain the desired resonant frequency of the oscillating element in consideration of the width and length of the beam forming portion and the width and length of the oscillating-element forming portion in the substrate in addition to the thickness of the beam forming portion, the piezoelectric layer of the piezoelectric element can be formed with higher precision. As a result, the advantage that a desired resonant frequency can be obtained with high precision can be improved further.

The resonant-oscillating-device fabrication method may be configured such that the piezoelectric-element formation step includes a piezoelectric-layer formation time determination step (S56) of determining the piezoelectric-layer formation time in accordance with the layer thickness of the piezoelectric layer among the piezoelectric-layer formation conditions, and the piezoelectric layer of the piezoelectric element is formed in the piezoelectric-layer formation time.

Because the piezoelectric layer of the piezoelectric element is formed in the piezoelectric-layer formation time determined in accordance with the layer thickness of the piezoelectric layer, the advantage that a desired resonant frequency can be obtained with high precision can be improved further.

In the resonant-oscillating-device fabrication method, the piezoelectric layer may be formed by either sputtering or the AD method, in the piezoelectric-element formation step.

This enables high-precision layer thickness adjustment. As a result, the advantage that a desired resonant frequency can be obtained with high precision can be improved further.

The piezoelectric-layer formation condition determination step may be configured such that (a1) the layer thickness "t" of the piezoelectric layer is determined in accordance with the characteristics indicating the relationship between the desired resonant frequency "Fo" and the layer thickness of the piezoelectric layer, (a2) the pre-piezoelectric-layer-formation resonant frequency "f" is determined in accordance with the characteristics indicating the relationship between the thickness of the substrate and the resonant frequency of the oscillating element before the piezoelectric layer formation, (a3) the layer thickness adjustment amount Δt is determined in accordance with the characteristics indicating the relationship between the difference ΔF between the resonant frequency "f" and the desired resonant frequency "Fo" and the layer thickness adjustment amount of the piezoelectric layer, and (a4) the adjusted layer thickness "to" of the piezoelectric layer is determined in accordance with the determined layer thickness "t" of the piezoelectric layer and the layer thickness adjustment amount Δt, and the adjusted layer thickness "to" is included in the piezoelectric-layer formation conditions.

This enables high-precision layer thickness adjustment. As a result, the advantage that a desired resonant frequency can be obtained with high precision can be improved further.

Fourth Embodiment

A process of fabricating the optical scanner 200 according to a fourth embodiment will be described below. Figures used for the following description use the identical reference symbols for the same elements as in the first embodiment. FIGS. 17(a) to 17(g) are sectional views showing changes in the sectional structure of the optical scanner 200 in the fabrication process, taken along line B-B in FIG. 1. FIGS. 18(a) to 18(g) are sectional views showing changes in the sectional structure of the optical scanner 200 in the fabrication process, taken along line A-A in FIG. 1.

1. Patterning Step S110

Figure 17:
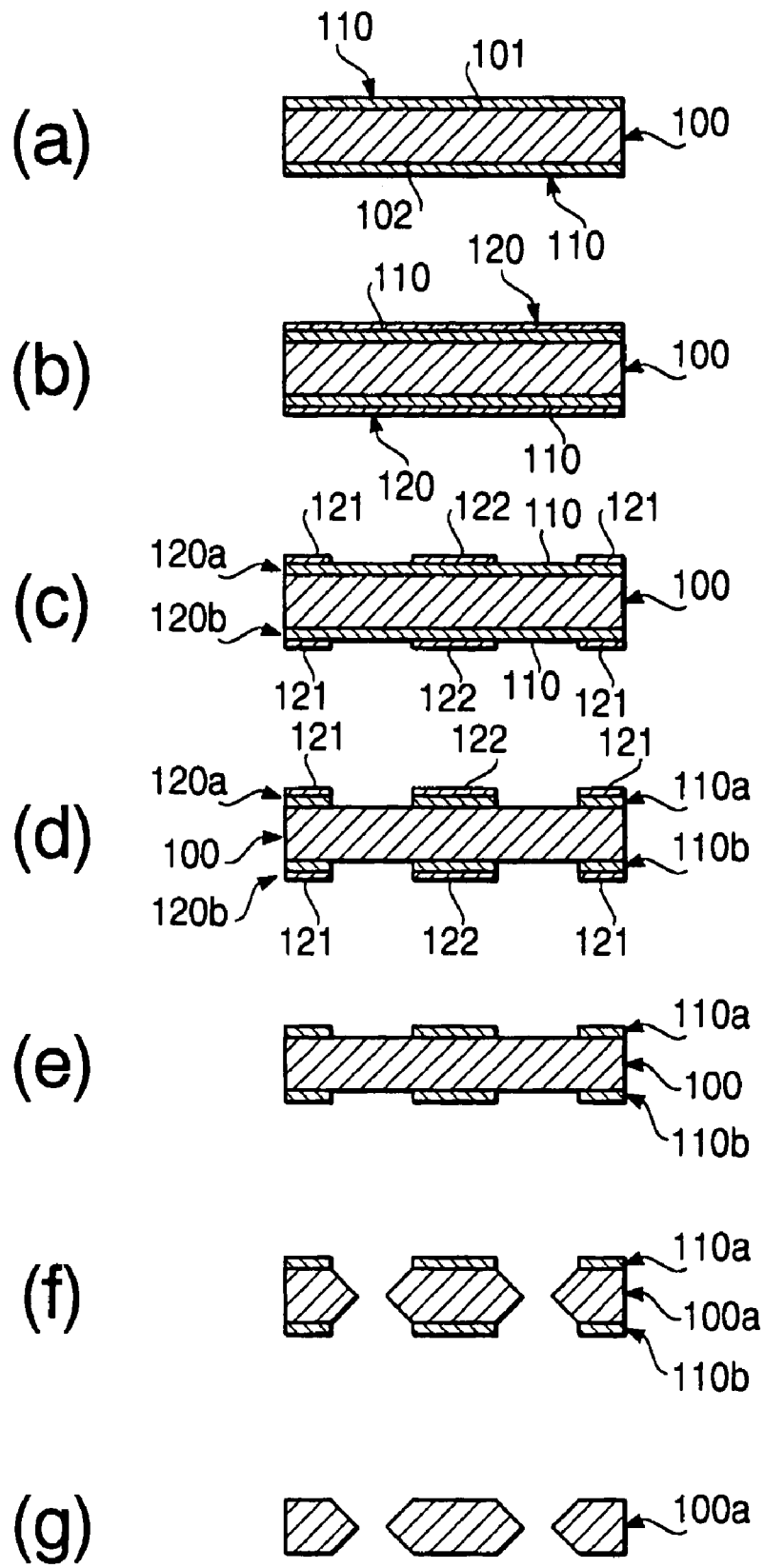
Figure 18:
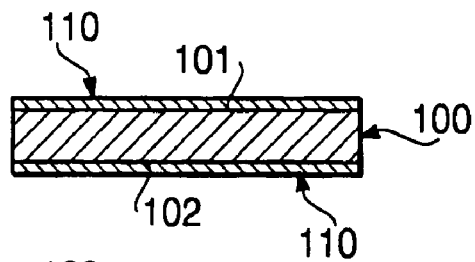
Figure 18:
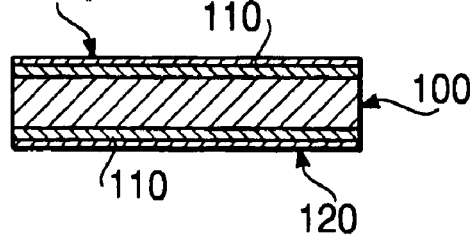
Figure 18:
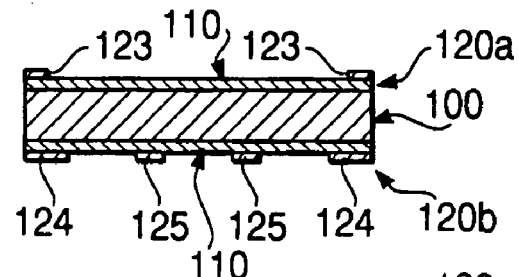
Figure 18:
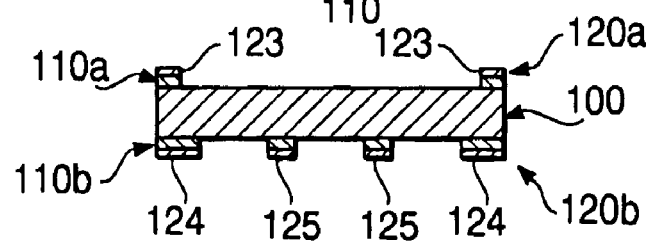
Figure 18:
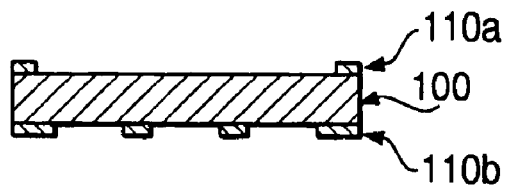
Figure 18:
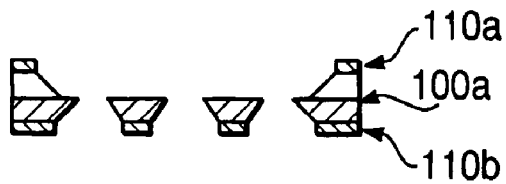
Figure 18:

In oxide layer formation step S111 of patterning step S110 (see FIG. 15), a top-surface oxide layer 110 is formed on the top surface 101 of a silicon substrate 100, and a bottom-surface oxide layer 110 is formed on the bottom surface 102 of the silicon substrate 100, as shown in FIG. 17(a) and FIG. 18(a).

Photolithography step S112 is performed next as a part of patterning step S110. In photoresist application step S112a in photolithography step S112, photoresist is applied on the outer surface of the top-surface and bottom-surface oxide layers 110, and a top-surface resist layer 120 and a bottom-surface resist layer 120 are formed as shown in FIG. 17(b) and FIG. 18(b).

In exposure step S112b, the two resist layers 120 are given a mask of a certain shape, and the two resist layers 120 are exposed to light. In development step S112c, the two resist layers 120 are developed. The two resist layers 120 are partly removed to remain the certain pattern as shown in FIG. 17(c) and FIG. 18(c), and the resist pattern layers 120a and 120b are formed. Now, photolithography step S112 ends.

In FIG. 17(c), the reference numerals 121 and 122 denote the cross sections of the resist pattern layers 120a and 120b taken along line B-B in FIG. 1. In FIG. 18(c), the reference numeral 123 denotes the cross section of the top-surface resist pattern layer 120a taken along line A-A in FIG. 1, and the reference numerals 124 and 125 denote the cross sections of the bottom-surface resist pattern layer 120b taken along line A-A in FIG. 1.

The cross sections denoted by the reference numeral 121 correspond to the cross section of the center in the front and back directions of the frame 10 of the optical scanner 200. The cross sections denoted by the reference numeral 122 correspond to the cross section of the reflecting mirror 30 of the optical scanner 200. In FIG. 18(c), the cross sections denoted by the reference numerals 123 and 124 correspond to the cross section of the rear side of the frame 10 of the optical scanner 200, and the cross sections denoted by the reference numeral 125 correspond to the cross sections of the pair of back beams 20 of the optical scanner 200.

After photolithography step S112 is completed, anisotropic wet etching is performed on the two oxide layers 10 through the two resist pattern layers 120a and 120b in oxide layer etching step S113. This forms the two oxide layers 110 into oxide pattern layers 110a and 110b having the same pattern as the two resist pattern layers 120a and 120b (see FIGS. 17(d) and 18(d)).

In photoresist removal step S114, the two resist pattern layers 120a and 120b are removed from the two oxide pattern layers 110a and 110b (see FIGS. 17(e) and 18(e)). Now, the operation of patterning step S110 is completed.

2. Substrate Etching Step S120

Substrate etching step S120 will be described with reference to FIGS. 15 and 16. In substrate etching step S120, the silicon substrate 100 is etched through the two oxide pattern layers 110a and 110b. In the fourth embodiment, (c1) to (c3) below are considered in substrate etching step S120:

(c1) Relationship Between the Specified Resonant Frequency "Fo" and the Thickness of the Silicon Substrate 100

The specified resonant frequency "Fo" is greatly affected by the thickness "b" of the beams 20, as indicated by the equations (1) and (2). The thickness of the silicon substrate 100 varies in the range of 90 μm to 110 μm.

Even if the resonant frequency "Fo" is specified on the assumption that the thickness of the silicon substrate 100 is constant, the specified resonant frequency "Fo" varies because the actual thickness of the silicon substrate 100 varies.

On this premise, the inventor and his colleagues examined the relationship between the specified resonant frequency "Fo" and variations in the thickness of the silicon substrate 100 by using the equation (1). More specifically, the inventor and his colleagues calculated the specified resonant frequency "Fo" by using the equation (1) while varying the half thickness which has a one-to-one correspondence with the thickness of the beam forming portion and a thin-wall forming portion in the silicon substrate 100.

As a result of the calculation, characteristics indicating the approximately linear relationship between the specified resonant frequency and the half thickness (hereafter referred to as the specified resonant frequency versus half thickness characteristics) were obtained as shown in the graph of FIG. 19. The specified resonant frequency versus half thickness characteristics show that the specified resonant frequency "Fo" varies almost linearly with the half thickness, as shown in the graph of FIG. 19.

If the half thickness is 45 μm, the specified resonant frequency "Fo" is 25.5 kHz in accordance with the specified resonant frequency versus half thickness characteristics. If the half thickness is 55 μm, the specified resonant frequency "Fo" is 29 kHz in accordance with the specified resonant frequency versus half thickness characteristics.

The ratio of change in the specified resonant frequency "Fo" to change in the half thickness was also checked, and it was found that the ratio of change in the specified resonant frequency varies in accordance with the change in the half thickness, as indicated in the graph of FIG. 20. According to the graph, when the thickness of the silicon substrate 100 is 100 μm, that is, when the half thickness is 50 μm, the ratio of change in the specified resonant frequency is 0%. This means that the error range in the half thickness at the beam forming portion and the thin-wall forming portion in the silicon substrate should be most minimized when the silicon substrate 100 has a thickness of 100 μm. As the thickness of the silicon substrate 100 decreases from 100 μm, the error range in the half thickness at the beam forming portion and the thin-wall forming portion in the silicon substrate becomes wider.

Therefore, if the thickness of the silicon substrate 100 varies in the range of 90 μm to 110 μm, it is preferred that the beam forming portion and the thin-wall forming portion in the silicon substrate be etched using the thickness of 90 μm of the silicon substrate 100 as the reference in the fabrication of the optical scanner 200. This means that the specified resonant frequency "Fo" should be specified as the resonant frequency of the optical scanner 200 fabricated from a silicon substrate having a thickness of 90 μm even if the thickness of the silicon substrate 100 varies.

(c2) Relationship Between the Thickness of the Silicon Substrate (Hereafter Referred to as the Substrate Thickness) and the Etching Time The silicon substrate 100 is wet-etched by using an etching solution. It is known that the substrate thickness decreases as the etching time of the silicon substrate 100 increases, as indicated in the graph in FIG. 21.

It is also known that the etching time varies with at least either temperature or concentration of the etching solution. More specifically, when the substrate thickness is constant, the etching time decreases as the concentration or temperature of the etching solution increases, and the etching time increases as the concentration or temperature of the etching solution decreases. The plot in the graph of FIG. 21 moves to a lower position on the coordinate plane as the concentration or temperature of the etching solution increases, and the plot moves to a higher position as the concentration or temperature of the etching solution decreases.

Accordingly, when the half thickness is determined and when the concentration and temperature of the etching solution are kept constant, the etching time required to etch the beam forming portion and the thin-wall forming portion from the substrate thickness to the half thickness can be obtained from the graph in FIG. 21.

(c3) Relationship Between the Etching Time and the Etching Amount

On the basis of the relationship between the etching time and the substrate thickness, the relationship between the etching time required to thin the silicon substrate 100 to the half thickness and the etching amount of the silicon substrate 100 to the half thickness of the beam forming portion and the thin-wall forming portion is linear as shown in the graph of FIG. 22. This means that the etching time required to thin the beam forming portion and the thin-wall forming portion of the silicon substrate 100 to the half thickness is given if the etching amount of the silicon substrate 100 to thin the beam forming portion and the thin-wall forming portion to the half thickness is known.

Accordingly, if the thickness of the silicon substrate 100 (substrate thickness) is known in advance, the etching time can be obtained from the graph in FIG. 22.

Based on the information given above, substrate etching step S120 will be described in detail. In substrate thickness measurement step S121 shown in FIG. 16, the thickness of the silicon substrate 100 is measured. In etching condition determination step S122, a half of the thickness of the silicon substrate 100 (half thickness) is obtained, and the half thickness is determined as an etching amount. The etching time is determined from the etching amount in accordance with the graph in FIG. 22. This etching time is specified as a main etching time.

When the measured thickness of the silicon substrate 100 is 90 μm, the half thickness is 45 μm. Because the etching amount is 45 μm, the main etching time obtained from the graph in FIG. 23 is 70 minutes. When the measured thickness of the silicon substrate 100 is 100 μm, the half thickness is 50 μm. Because the etching amount is 50 μm, the main etching time obtained from the graph in FIG. 22 is 80 minutes.

Potassium hydroxide (KOH) at a 40% concentration is used as the etching solution. The concentration and temperature of the etching solution should be kept constant.

Etching condition determination step S122 is followed by main etching step S123. The etching solution is put into an etching bath (not shown), and the silicon substrate 100 is left in the etching solution in the etching bath for the main etching time. With this, the silicon substrate 100 undergoes anisotropic wet etching by the etching solution through the two oxide pattern layers 110a and 110b. This turns the silicon substrate 100 into a main etching substrate 100a (FIGS. 17(f) and 18(f)).

In the fourth embodiment, the concentration and temperature of the etching solution are adjusted in the etching bath. An etching solution supply line and a pure water supply line (not shown) are connected to the etching bath. The temperature and concentration of the etching solution in the etching bath are detected by a temperature sensor and a concentration sensor respectively.

At least either the etching solution coming from the etching solution supply line or pure water coming from the pure water supply line is put into the etching bath in accordance with the detection output from the concentration sensor, so that the concentration of the etching solution in the etching bath is kept constant. The temperature of the etching solution in the etching bath is kept to a constant level (such as 23° C.) by a heating apparatus (not shown) in accordance with the detection output from the temperature sensor.

After main etching step S123, the penetration state of the main etching substrate 100a is inspected visually or by a transmission type sensor or a reflection type sensor in penetration confirmation step S124. Then, in half-thickness measurement step S125, the half thickness after etching of the beam forming portion and thin-wall forming portion of the main etching substrate 100a is measured.

When the thickness measured after the etching of the beam forming portion and thin-wall forming portion is a half of the thickness of 90 μm of the silicon substrate 100, etching of the silicon substrate 100 ends. If the thickness measured after the etching of the beam forming portion and thin-wall forming portion is greater than a half of the thickness of 90 μm of the silicon substrate 100, further etching of the main etching substrate 100a is necessary.

In additional etching step S126, the main etching substrate 100a undergoes further etching (additional etching or overetching) through the two oxide pattern layers 110a and 110b.

If the thickness of the silicon substrate 100 is 100 μm, the half thickness at the beam forming portion and thin-wall forming portion of the main etching substrate 100a is 50 μm. Accordingly, the additional etching amount is 50 μm–45 μm=5 μm. The additional etching time obtained from the graph in FIG. 22 is 80 minutes–70 minutes=10 minutes.

The main etching substrate 100a is put into the etching solution in the etching bath for the additional etching time and undergoes wet etching through the two oxide pattern layers 110a and 110b. Then, the thickness of the beam forming portion and thin-wall forming portion in the main etching substrate 100a becomes a half of the thickness of 90 μm of the silicon substrate.

If the half thickness of the silicon substrate 100 after main etching is greater than 45 μm, the beam forming portion and thin-wall forming portion in the main etching substrate 100a is etched further by an additional etching amount or for an addition etching time corresponding to the difference between the corresponding half thickness and 45 μm to form an additional etching substrate. Now, with a silicon substrate 100 having a thickness of 100 μm, the specified resonant frequency "Fo" obtained with the silicon substrate 100 having a thickness of 90 μm can be obtained.

An optical scanner fabricated by using a silicon substrate having a certain thickness was examined in terms of variations in the specified resonant frequency "Fo" depending on variations in the additional etching amount. The relationship between the specified resonant frequency and the additional etching amount as shown in the graph of FIG. 23 was obtained. This shows how the specified resonant frequency "Fo" varies with changes in the additional etching amount accompanying variations in the half thickness. Silicon substrates having any thickness show common variations, and FIG. 23 shows variations in the silicon substrate having a thickness of 100 μm alone.

The figure shows that the specified resonant frequency "Fo" is 27.5 kHz, when the half thickness is 50 μm and when the additional etching amount is 0 μm, for instance. If the half thickness is 45 μm, the additional etching amount is 5 μm, and the specified resonant frequency "Fo" is 24 kHz, according to the figure. If an optical scanner fabricated with the silicon substrate 100 having a thickness of 90 μm, which is the lower limit of the range of variations in the thickness, has a resonant frequency of 24 kHz, the same can be fabricated with the silicon substrate 100 having a thickness of 100 μm by main etching of 50 μm and additional etching of 5 μm.

Changes in the specified resonant frequency "Fo" caused by variations in the additional etching time were examined, and the relationship between the specified resonant frequency and the additional etching time as shown in the graph of FIG. 24 was obtained. The graph of FIG. 24 represents the same characteristics as the graph of FIG. 23.

After substrate etching step S120, the two oxide pattern layers 110a and 110b are removed from the main etching substrate 100a or the additional etching substrate in oxide pattern layer removal step S130 shown in FIG. 15 (see FIGS. 17(g) and 18(g)).

Then, driving element formation step S140 (see FIG. 15) follows. In lower electrode layer formation step S141, a lower electrode layer is formed on the entire surface of the main etching substrate 100a or the additional etching substrate, and a piezoelectric layer is formed on the entire lower electrode layer. Then, in upper electrode layer formation step S143, an upper electrode layer is formed on the entire piezoelectric layer.

After the layers are formed, the upper electrode layer, the piezoelectric layer, and the lower electrode layer on the portions other than the beams 20 are removed. This forms piezoelectric elements 40 on the corresponding beams 20, and the fabrication of the optical scanner 200 ends.

After the optical scanner is fabricated, the optical scanner 200 is driven in resonant frequency verification step S150, and the resonant frequency of the reflecting mirror 30 is verified. If the verification step indicates that the resonant frequency of the fabricated optical scanner matches the specified resonant frequency "Fo" obtained with a silicon substrate 100 having a thickness of 90 μm, the optical scanner 200 is considered to be acceptable.

In the fourth embodiment, when the optical scanner 200 is fabricated, the thickness of the silicon substrate 100 is measured in substrate thickness measurement step S121 in substrate etching step S120 (see FIGS. 15 and 16); and then the etching time is determined from the etching amount corresponding to a half of the measured thickness (half thickness) in accordance with the graph in FIG. 22 and the etching solution is determined, in etching condition determination step S122.

In main etching step S123, the beam forming portion and the thin-wall forming portion of the silicon substrate 100 undergo wet etching in the etching solution for the etching time. The concentration and temperature of the etching solution are kept constant.

The post-etching thickness of the beam forming portion and the thin-wall forming portion of the main etching substrate formed by wet etching is measured in half-thickness measurement step S125. If the measured thickness matches a half of the 90-μm lower limit of the range of variations in the thickness of the silicon substrate 100, etching of the silicon substrate 100 is completed by main etching step S123.

If the thickness measured in half-thickness measurement step S125 is greater than a half of the lower limit of the range of variations in the thickness of the silicon substrate 100, the post-etching beam forming portion and thin-wall forming portion in the main etching substrate are etched further in additional etching step S126.

In this etching step, an etching amount corresponding to the difference between the thickness of the beam forming portion and the thin-wall forming portion of the main etching substrate and the half thickness of the 90-μm lower limit of the range of variations in the thickness of the silicon substrate 100 is determined as an additional etching amount. An additional etching time corresponding to the additional etching amount is determined in accordance with the graph of FIG. 22. The main etching substrate undergoes further wet etching for the additional etching time.

If the measured thickness of the silicon substrate 100 is greater than 90 μm, the resonant frequency is adjusted to the one obtained when the thickness of the beam forming portion and the thin-wall forming portion of the silicon substrate 100 matches the 90-μm lower limit of the range of variations in the thickness of the silicon substrate 100. As a result, even if the measured thickness of the silicon substrate 100 is greater than 90 μm, the specified resonant frequency, which is one of the characteristics of the optical scanner fabricated from the silicon substrate 100, is adjusted to the resonant frequency specified with the half thickness obtained when the silicon substrate 100 has a thickness of 90 μm.

Even if the thickness of the silicon substrate 100 is greater than the lower limit of the range of variations in the thickness of the silicon substrate 100 due to the variations described above, the beam forming portion and the thin-wall forming portion of the silicon substrate 100 undergoes main etching down to the half thickness, and then additional etching is performed to a half of the lower limit (90 μm) of the range of variations in the thickness of the silicon substrate 100.

In other words, if the thickness of the silicon substrate 100 varies, the etching conditions are adjusted in the etching condition determination step, and the thickness of the beam forming portion and the thin-wall forming portion of the silicon substrate 100 is adjusted by etching in the main etching step or by the main etching step and the additional etching step. With the two-step etching of the silicon substrate 100, the specified resonant frequency specified with a half of the 90-μm lower limit of the range of variations in the thickness of the silicon substrate 100 can be obtained with high precision. As a result, the specified resonant frequency of the optical scanner 200 is adjusted with high precision to the resonant frequency specified with the half thickness obtained when the silicon substrate 100 has a thickness of 90 μm.

If the thickness of the silicon substrate is greater than 90 μm, the two-step etching makes the entire etching of the silicon substrate easier, because the etching precision of the beam forming portion and the thin-wall forming portion can be lowered in main etching, and the additional etching of the beam forming portion and the thin-wall forming portion following the main etching should be performed precisely.

By the two-step etching, the specified resonant frequency of the optical scanner is obtained with high precision. This eliminates the need for additional etching of the beam forming portion and the thin-wall forming portion in the silicon substrate for obtaining the specified resonant frequency after resonant frequency verification step S150. Consequently, the specified resonant frequency of the optical scanner 200 can be precisely adjusted to the desired specified level, without the need for adding an extra step to the process of fabricating the optical scanner 200.

If it is considered that the thickness of the beams is a major factor that affects the specified resonant frequency, the etching conditions for adjusting the specified resonant frequency to the desired level can be determined easily. The conventional etching method can be directly used. Accordingly, the fabrication method described in the first embodiment is inexpensive and very efficient.

As described above, according to the fourth embodiment, a very efficient fabrication method can be provided especially in terms of management of small batches of a variety of products and the low cost that are likely to occur when optical scanners are fabricated by using micromachining technique.

In the fourth embodiment, the silicon substrate is etched by using the 90-μm lower limit of the range of variations in the thickness of the silicon substrate as the reference, as described above. If the silicon substrate is etched by using a thickness, such as 85 μm, smaller than the lower limit of 90 μm as the reference, the specified resonant frequency can be easily and precisely obtained with a silicon substrate having the thickness of the lower limit (90 μm).

In the fourth embodiment, if the thickness of the silicon substrate is greater than the lower limit of 90 μm of the range of variations in the thickness of the silicon substrate, the beam forming portion and the thin-wall forming portion in the silicon substrate undergo main etching until the thickness is halved, then additional etching is performed to a half of the lower limit. Instead, etching may be performed such that the main etching is performed until a thickness other than the half thickness is obtained, and the additional etching is performed until a thickness other than a half of the lower limit is obtained.

Fifth Embodiment

An essential part of a fifth embodiment of the present invention will be described next. The fifth embodiment differs from the fourth embodiment in that the concentration of the etching solution is controlled in the etching bath in order to adjust the etching time corresponding to an identical etching amount in main etching step S123 (see FIG. 16). Accordingly, the supply amount of at least either the etching solution coming from the etching solution supply line or pure water coming from the pure water supply line is controlled in accordance with the detection output of the concentration sensor.

Assuming that the plot in the graph of FIG. 21 moves on the coordinate plane in accordance with the concentration of the etching solution in the etching bath, as described in the fourth embodiment, the fifth embodiment uses the movement of the plot in the graph of FIG. 22 on the coordinate plane in accordance with the concentration of the etching solution for the control operation. More specifically, the slope of the plot of the etching rate in the graph of FIG. 22 increases on the coordinate plane as the concentration of the etching solution increases, and the slope of the etching rate decreases as the concentration of the etching solution decreases.

For instance, to reduce the etching time for an identical etching amount in the fifth embodiment, the amount of the etching solution supplied from the etching solution supply is reduced, thereby reducing the concentration of the etching solution in the etching bath. This reduces the etching time corresponding to the identical etching amount shown in the graph of FIG. 22. Consequently, the etching time of the beam forming portion and the thin-wall forming portion in the silicon substrate 100 is reduced, enabling fast etching.

To increase the etching time for an identical etching amount, the amount of the etching solution supplied from the etching solution supply line is increased, thereby increasing the concentration of the etching solution in the etching bath. This increases the etching time corresponding to the identical etching amount shown in the graph of FIG. 22. Consequently, the etching time of the beam forming portion and the thin-wall forming portion in the silicon substrate 100 increases, enabling slow etching. The other elements and advantages are the same as in the fourth embodiment.

Sixth Embodiment

An essential part of a sixth embodiment of the present invention will be described next. The sixth embodiment differs from the fourth embodiment in that the temperature of the etching solution in the etching bath is controlled in accordance with the detection output from the temperature sensor, in order to adjust the etching time for an etching amount in main etching step S123 (see FIG. 16).

Assuming that the plot in the graph of FIG. 21 moves on the coordinate plane in accordance with the temperature of the etching solution in the etching bath, as described in the fourth embodiment, the sixth embodiment uses the movement of the plot in the graph of FIG. 22 on the coordinate plane in accordance with the temperature of the etching solution for the control operation. More specifically, the plot in the graph of FIG. 22 moves downward in the shown figure on the coordinate plane as the temperature of the etching solution increases, and the plot moves upward in the shown figure as the temperature of the etching solution decreases.

For instance, to reduce the etching time for an identical etching amount in the sixth embodiment, the temperature of the etching solution in the etching bath is increased. This reduces the etching time corresponding to the identical etching amount shown in the graph of FIG. 22. Consequently, the etching time of the beam forming portion and the thin-wall forming portion in the silicon substrate 100 is reduced, enabling fast etching.

To increase the etching time for an identical etching amount, the temperature of the etching solution in the etching bath is decreased. This increases the etching time corresponding to the identical etching amount shown in the graph of FIG. 22. Consequently, the etching time of the beam forming portion and the thin-wall forming portion in the silicon substrate 100 increases, enabling slow etching. The other elements and advantages are the same as in the fourth embodiment.

The present invention is not limited to the embodiments described above, and a variety of modifications can be configured as follows: (v1) Instead of the silicon substrate, a stainless-steel substrate may be used, for instance. (v2) The optical scanner 200 does not always need to have a pair of beams 20 in the front and back and may have one beam each in the front and back. (v3) The present invention may be applied to a variety of resonant oscillating devices such as a galvano device which uses resonant oscillation for scanning and an acceleration sensor using resonant oscillation for acceleration sensing, in addition to the optical scanner. (v4) Etching of the silicon substrate is not limited to wet etching, and dry etching may be performed.

Some aspects of the present invention described as the fourth to sixth embodiments will be summarized. The characteristics of the resonant-oscillating-device fabrication method can be explained as follows: The resonant-oscillating-device fabrication method of the embodiments have the thickness measurement step (S121) for measuring the thickness of the substrate, the etching condition determination step (S122) for determining the etching conditions of the beam forming portion in the substrate in accordance with the thickness of the substrate measured in the thickness measurement step so that the specified resonant frequency is obtained, and the etching steps (S123, S126) for etching the substrate in accordance with the etching conditions. The numbers in the parentheses following the elements are given to clarify the correspondence between each element and the corresponding specific means described in the embodiments. Those numbers are not used to limit the invention to the embodiments.

In thickness measurement step of the resonant-oscillating-device fabrication method, the thickness of the beam forming portion in the substrate may be measured as the thickness of the substrate.

This will further improve the precision of etching of the beam forming portion in the substrate in accordance with the etching conditions. Accordingly, the advantage that a desired resonant frequency can be obtained with high precision can be improved further.

In the etching condition determination step of the resonant-oscillating-device fabrication method, the etching conditions may be determined to obtain the specified resonant frequency by an etching time of wet etching with the etching solution.

This will improve the appropriateness of etching of the substrate, improving the advantage that the desired resonant frequency can be obtained with high precision.

The etching condition determination step may be configured such that the etching time is determined from the measured thickness of the substrate in accordance with the relationship between the etching time and the measured thickness of the substrate; the specified resonant frequency is determined from the measured thickness of the substrate in accordance with the relationship between the resonant frequency and the measured thickness of the substrate; and the etching conditions are determined to obtain the specified resonant frequency by the etching time.

The advantage that a desired resonant frequency can be obtained with high precision can be obtained further surely by determining etching conditions based on the etching time and the specified resonant frequency determined in accordance with the relationship between the etching time and the measured thickness of the substrate and the relationship between the resonant frequency and the measured thickness of the substrate.

In the etching condition determination step of the resonant-oscillating-device fabrication method, the etching time may be adjusted in accordance with at least either the concentration or the temperature of the etching solution.

This allows the etching time to be adjusted in consideration of either the concentration or the temperature of the etching solution. As a result, the advantage that the desired resonant frequency can be obtained with high precision can be obtained more appropriately.

If the etching conditions are specified to bring the resonant frequency of the oscillating element formed by penetrating a portion in a substrate having the lowest thickness in the range of variations in the thickness of the substrate to the desired resonant frequency and if the measured thickness of the substrate exceeds the lowest thickness in the range of variations, over-etching may be performed in the etching step until the desired resonant frequency is obtained. This allows the desired resonant frequency to be obtained as a value for the substrate having the lowest thickness even if the thickness of the substrate varies. As a result, the advantage that the desired resonant frequency can be obtained with high precision without varying with variations in the thickness of the substrate can be obtained. If the thickness of the substrate is close to the lowest thickness, the etching process becomes simple because over-etching is unnecessary.

The etching step may use first etching conditions specified to bring the resonant frequency of the oscillating element formed by penetrating a portion in a substrate having the lowest thickness in the range of variations in the thickness of the substrate to the desired resonant frequency and second etching conditions to be used in over-etching, differing from the first etching conditions.

With the first and second different etching conditions of the substrate, each part of the resonant oscillating device can undergo optimum etching, the entire etching of the substrate can be simplified, and the advantage that a desired resonant frequency is obtained with high precision can be obtained.

What is claimed is:

1. A resonant-oscillating-device fabrication method for integrally forming a structure comprising a support, a beam vibratably extending from the support, and an oscillating element which is supported by the beam so as to oscillate in resonance with the vibration of the beam at a desired resonant frequency, by using a substrate, the resonant-oscillating-device fabrication method comprising:
   a thickness measurement step of measuring the thickness of the substrate;
   an etching condition determination step of determining conditions of etching a portion forming the beam in the substrate to provide the desired resonant frequency, in accordance with the thickness of the substrate measured in the thickness measurement step; and
   an etching step of etching the substrate in accordance with the etching conditions.

2. The resonant-oscillating-device fabrication method according to claim 1, wherein the thickness of the portion forming the beam in the substrate is measured as the thickness of the substrate in the thickness measurement step.

3. The resonant-oscillating-device fabrication method according to claim 1, wherein the etching conditions are determined to obtain the desired resonant frequency in an etching time of wet etching with an etching solution, in the etching condition determination step.

4. The resonant-oscillating-device fabrication method according to claim 3, wherein the etching time is determined from the measured thickness of the substrate in accordance with a predetermined relationship between the etching time and the measured thickness of the substrate; the desired resonant frequency is determined from the measured thickness of the substrate in accordance with a predetermined relationship between the resonant frequency and the measured thickness of the substrate; and the etching conditions are determined to obtain the desired resonant frequency in the etching time, in the etching condition determination step.

5. The resonant-oscillating-device fabrication method according to claim 3, wherein the etching time is adjusted in accordance with at least one of the concentration and the temperature of the etching solution in the etching condition determination step.

6. The resonant-oscillating-device fabrication method according to claim 1, wherein, in the etching step, the etching conditions are specified to bring the resonant frequency of the oscillating element formed by penetrating a portion in a substrate having the lowest thickness in the range of variations in the thickness of the substrate to the desired resonant frequency; and
   when the measured thickness of the substrate exceeds the lowest thickness in the range of variations, over-etching is performed until the desired resonant frequency is obtained.

7. The resonant-oscillating-device fabrication method according to claim 6, wherein, in the etching step, the etching conditions comprise first etching conditions specified to bring the resonant frequency of the oscillating element formed by penetrating the portion in the substrate having the lowest thickness in the range of variations in the thickness of the substrate to the desired resonant frequency, and second etching conditions to be used in the over-etching, differing from the first etching conditions.

* * * * *